United States Patent
Maxwell et al.

(10) Patent No.: US 9,685,608 B2
(45) Date of Patent: Jun. 20, 2017

(54) REDUCED DIFFUSION IN METAL ELECTRODE FOR TWO-TERMINAL MEMORY

(71) Applicant: Crossbar, Inc., Santa Clara, CA (US)

(72) Inventors: Steven Patrick Maxwell, Sunnyvale, CA (US); Sung Hyun Jo, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 99 days.

(21) Appl. No.: 14/207,430

(22) Filed: Mar. 12, 2014

(65) Prior Publication Data

US 2014/0192589 A1   Jul. 10, 2014

Related U.S. Application Data

(63) Continuation-in-part of application No. 13/447,036, filed on Apr. 13, 2012, now Pat. No. 8,946,667, and
(Continued)

(51) Int. Cl.
*H01L 45/00* (2006.01)
*G11C 13/00* (2006.01)

(52) U.S. Cl.
CPC ...... *H01L 45/1266* (2013.01); *G11C 13/0002* (2013.01); *G11C 13/0011* (2013.01);
(Continued)

(58) Field of Classification Search
CPC ... H01L 45/1266; H01L 45/085; H01L 45/12; H01L 45/1233; H01L 45/142;
(Continued)

(56) References Cited

U.S. PATENT DOCUMENTS

| 680,652 A | 8/1901 | Leonard |
| 4,433,468 A | 2/1984 | Kawamata |

(Continued)

FOREIGN PATENT DOCUMENTS

| CN | 101131872 A | 2/2008 |
| CN | 101170132 A | 4/2008 |

(Continued)

OTHER PUBLICATIONS

Japanese Office Action mailed on Aug. 9, 2016 for Japanese Application No. 2014-513700, 8 pages (including translation).
(Continued)

*Primary Examiner* — Cuong B Nguyen
*Assistant Examiner* — Juanita Rhodes
(74) *Attorney, Agent, or Firm* — Amin, Turocy & Watson, LLP

(57) ABSTRACT

Providing for two-terminal memory that mitigates diffusion of external material therein is described herein. In some embodiments, a two-terminal memory cell can comprise an electrode layer. The electrode layer can be at least in part permeable to ionically or chemically reactive material, such as oxygen or the like. The two-terminal memory can further comprise a diffusion mitigation material disposed between the electrode layer and external material. This diffusion mitigation material can be selected to mitigate or prevent diffusion of the undesired element(s) or compound(s), to mitigate or avoid exposure of such element(s) or compound(s) to the electrode layer. Accordingly, degradation of the two-terminal memory as a result of contact with the undesired element(s) or compound(s) can be mitigated by various disclosed embodiments.

20 Claims, 8 Drawing Sheets

Related U.S. Application Data a continuation-in-part of application No. PCT/US2013/054976, filed on Aug. 14, 2013, which is a continuation of application No. 13/585,759, filed on Aug. 14, 2012, now Pat. No. 8,569,172, application No. 14/207,430, which is a continuation-in-part of application No. 14/034,390, filed on Sep. 23, 2013, now abandoned, which is a continuation of application No. 13/585,759, filed on Aug. 14, 2012, now Pat. No. 8,569,172.

(60) Provisional application No. 61/786,113, filed on Mar. 14, 2013.

(52) U.S. Cl.
CPC ............ *H01L 45/085* (2013.01); *H01L 45/12* (2013.01); *H01L 45/1233* (2013.01); *H01L 45/142* (2013.01); *H01L 45/143* (2013.01); *H01L 45/145* (2013.01); *H01L 45/146* (2013.01); *H01L 45/148* (2013.01); *H01L 45/16* (2013.01); *G11C 2213/51* (2013.01); *G11C 2213/52* (2013.01); *G11C 2213/56* (2013.01); *G11C 2213/77* (2013.01)

(58) Field of Classification Search
CPC ... H01L 45/143; H01L 45/145; H01L 45/148; H01L 45/16; H01L 45/146; G11C 13/0002; G11C 13/0011; G11C 2213/51; G11C 2213/52; G11C 2213/56; G11C 2213/77
See application file for complete search history.

(56) References Cited

U.S. PATENT DOCUMENTS

| | | | |
|---|---|---|---|
| 4,684,972 A | 8/1987 | Owen et al. | |
| 4,741,601 A | 5/1988 | Saito | |
| 4,994,866 A | 2/1991 | Awano | |
| 5,139,911 A | 8/1992 | Yagi et al. | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,499,208 A | 3/1996 | Shoji | |
| 5,538,564 A | 7/1996 | Kaschmitter | |
| 5,541,869 A | 7/1996 | Rose et al. | |
| 5,594,363 A | 1/1997 | Freeman et al. | |
| 5,596,214 A | 1/1997 | Endo | |
| 5,614,756 A | 3/1997 | Forouhi et al. | |
| 5,627,451 A | 5/1997 | Takeda | |
| 5,645,628 A | 7/1997 | Endo et al. | |
| 5,673,223 A | 9/1997 | Park | |
| 5,707,487 A | 1/1998 | Hori et al. | |
| 5,714,416 A | 2/1998 | Eichman et al. | |
| 5,751,012 A | 5/1998 | Wolstenholme et al. | |
| 5,763,898 A | 6/1998 | Forouhi et al. | |
| 5,840,608 A | 11/1998 | Chang | |
| 5,923,587 A | 7/1999 | Choi | |
| 5,970,332 A | 10/1999 | Pruijmboom et al. | |
| 5,973,335 A | 10/1999 | Shannon | |
| 5,998,244 A | 12/1999 | Wolstenholme et al. | |
| 6,002,268 A | 12/1999 | Sasaki et al. | |
| 6,037,204 A | 3/2000 | Chang et al. | |
| 6,122,318 A | 9/2000 | Yamaguchi et al. | |
| 6,128,214 A | 10/2000 | Kuekes et al. | |
| 6,143,642 A | 11/2000 | Sur, Jr. et al. | |
| 6,180,998 B1 | 1/2001 | Crafts | |
| 6,181,587 B1 | 1/2001 | Kuramoto et al. | |
| 6,181,597 B1 | 1/2001 | Nachumovsky | |
| 6,259,116 B1 | 7/2001 | Shannon | |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,552,932 B1 | 4/2003 | Cernea |
| 6,627,530 B2 | 9/2003 | Li et al. |
| 6,674,109 B1 | 1/2004 | Fujimori et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,816,405 B1 | 11/2004 | Lu et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li et al. |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen et al. |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,791,060 B2 | 9/2010 | Aochi et al. |

(56) References Cited

U.S. PATENT DOCUMENTS

| | | |
|---|---|---|
| 7,824,956 B2 | 11/2010 | Schricker et al. |
| 7,829,875 B2 | 11/2010 | Scheuerlein |
| 7,830,698 B2 | 11/2010 | Chen et al. |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 | 11/2012 | Nazarian |
| 8,351,241 B2 | 1/2013 | Lu et al. |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik et al. |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 | 12/2013 | Nguyen et al. |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee et al. |
| 8,854,859 B2 | 10/2014 | Chung |
| 8,934,294 B2 | 1/2015 | Kim et al. |
| 8,946,667 B1 | 2/2015 | Clark et al. |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 2002/0048940 A1* | 4/2002 | Derderian .......... C23C 16/0281 438/650 |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0162881 A1 | 7/2005 | Stasiak et al. |
| 2005/0175099 A1 | 8/2005 | Sarkijarvi et al. |
| 2006/0017488 A1 | 1/2006 | Hsu |
| 2006/0028895 A1 | 2/2006 | Taussig et al. |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1 | 9/2006 | Baek et al. |
| 2006/0231910 A1 | 10/2006 | Hsieh et al. |
| 2006/0246606 A1 | 11/2006 | Hsu et al. |
| 2006/0268594 A1 | 11/2006 | Toda |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0035990 A1 | 2/2007 | Hush |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner et al. |
| 2007/0105390 A1 | 5/2007 | Oh |
| 2007/0133250 A1 | 6/2007 | Kim |
| 2007/0133270 A1 | 6/2007 | Jeong et al. |
| 2007/0159869 A1 | 7/2007 | Baek et al. |
| 2007/0159876 A1 | 7/2007 | Sugibayashi et al. |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |

(56) References Cited

U.S. PATENT DOCUMENTS

| | | |
|---|---|---|
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1* | 1/2009 | Lu ............ H01L 27/2472 257/4 |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0268513 A1 | 10/2009 | De Ambroggi et al. |
| 2009/0272962 A1* | 11/2009 | Kumar ............ H01L 45/08 257/4 |
| 2009/0283737 A1 | 11/2009 | Kiyotoshi |
| 2009/0298224 A1 | 12/2009 | Lowrey |
| 2009/0309087 A1 | 12/2009 | Lung |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1* | 2/2010 | Lee ............ H01L 45/08 257/758 |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Lambertson |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1* | 8/2010 | Kong ............ H01L 21/02068 438/694 |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1* | 10/2010 | Phatak ............ H01L 45/1253 257/4 |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1* | 12/2011 | Jo ............ G11C 13/0002 365/148 |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1* | 1/2012 | Lu ............ G11C 13/0002 365/148 |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1* | 2/2012 | Wang ............ G11C 13/0007 365/148 |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1* | 4/2012 | Kuo ............ G11C 7/18 365/72 |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1* | 5/2012 | Herner ............ H01L 45/085 438/382 |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |

(56) References Cited

U.S. PATENT DOCUMENTS

| | | | |
|---|---|---|---|
| 2012/0155146 A1 | 6/2012 | Ueda et al. | |
| 2012/0176831 A1 | 7/2012 | Xiao et al. | |
| 2012/0205606 A1 | 8/2012 | Lee et al. | |
| 2012/0205793 A1* | 8/2012 | Schieffer | H01L 21/321 257/734 |
| 2012/0218807 A1 | 8/2012 | Johnson | |
| 2012/0220100 A1 | 8/2012 | Herner | |
| 2012/0224413 A1 | 9/2012 | Zhang et al. | |
| 2012/0235112 A1 | 9/2012 | Huo et al. | |
| 2012/0236625 A1 | 9/2012 | Ohba et al. | |
| 2012/0241710 A1 | 9/2012 | Liu et al. | |
| 2012/0243292 A1 | 9/2012 | Takashima et al. | |
| 2012/0250183 A1 | 10/2012 | Tamaoka et al. | |
| 2012/0252183 A1 | 10/2012 | Herner | |
| 2012/0269275 A1 | 10/2012 | Hannuksela | |
| 2012/0305874 A1 | 12/2012 | Herner | |
| 2012/0305879 A1 | 12/2012 | Lu et al. | |
| 2012/0320660 A1 | 12/2012 | Nazarian et al. | |
| 2012/0326265 A1 | 12/2012 | Lai et al. | |
| 2012/0327701 A1 | 12/2012 | Nazarian | |
| 2013/0020548 A1 | 1/2013 | Clark et al. | |
| 2013/0023085 A1 | 1/2013 | Pramanik et al. | |
| 2013/0026440 A1 | 1/2013 | Yang et al. | |
| 2013/0065066 A1* | 3/2013 | Sambasivan | C03C 1/008 428/432 |
| 2013/0075685 A1 | 3/2013 | Li et al. | |
| 2013/0075688 A1 | 3/2013 | Xu et al. | |
| 2013/0119341 A1* | 5/2013 | Liu | G11C 13/0002 257/4 |
| 2013/0128653 A1 | 5/2013 | Kang et al. | |
| 2013/0134379 A1 | 5/2013 | Lu | |
| 2013/0166825 A1 | 6/2013 | Kim et al. | |
| 2013/0207065 A1* | 8/2013 | Chiang | H01L 45/1253 257/2 |
| 2013/0214234 A1* | 8/2013 | Gopalan | H01L 45/085 257/3 |
| 2013/0235648 A1 | 9/2013 | Kim et al. | |
| 2013/0264535 A1 | 10/2013 | Sonehara | |
| 2013/0279240 A1 | 10/2013 | Jo | |
| 2013/0308369 A1 | 11/2013 | Lu et al. | |
| 2014/0015018 A1 | 1/2014 | Kim | |
| 2014/0029327 A1 | 1/2014 | Strachan et al. | |
| 2014/0070160 A1 | 3/2014 | Ishikawa et al. | |
| 2014/0103284 A1* | 4/2014 | Hsueh | H01L 45/1608 257/4 |
| 2014/0145135 A1 | 5/2014 | Gee et al. | |
| 2014/0166961 A1 | 6/2014 | Liao et al. | |
| 2014/0175360 A1 | 6/2014 | Tendulkar et al. | |
| 2014/0177315 A1 | 6/2014 | Pramanik et al. | |
| 2014/0192589 A1 | 7/2014 | Maxwell et al. | |
| 2014/0197369 A1 | 7/2014 | Sheng et al. | |
| 2014/0233294 A1 | 8/2014 | Ting et al. | |
| 2014/0264236 A1 | 9/2014 | Kim et al. | |
| 2014/0264250 A1 | 9/2014 | Maxwell et al. | |
| 2014/0268997 A1 | 9/2014 | Nazarian et al. | |
| 2014/0268998 A1 | 9/2014 | Jo | |
| 2014/0269002 A1 | 9/2014 | Jo | |
| 2014/0312296 A1 | 10/2014 | Jo et al. | |
| 2014/0335675 A1 | 11/2014 | Narayanan | |
| 2015/0070961 A1 | 3/2015 | Katayama et al. | |
| 2015/0228334 A1 | 8/2015 | Nazarian et al. | |
| 2016/0111640 A1 | 4/2016 | Chang et al. | |

FOREIGN PATENT DOCUMENTS

| | | |
|---|---|---|
| CN | 101501850 A | 8/2009 |
| CN | 101636792 A | 1/2010 |
| CN | 102024494 A | 4/2011 |
| CN | 102077296 A | 5/2011 |
| EP | 1096465 A2 | 5/2001 |
| EP | 2405441 A1 | 1/2012 |
| EP | 2408035 A2 | 1/2012 |
| JP | 2005506703 A | 3/2005 |
| JP | 2006032951 A | 2/2006 |
| JP | 2007067408 A | 3/2007 |
| JP | 2007281208 A | 10/2007 |
| JP | 2007328857 A | 12/2007 |
| JP | 2008503085 A | 1/2008 |
| JP | 2008147343 A | 6/2008 |
| JP | 2009043873 A | 2/2009 |
| JP | 2011023645 A | 2/2011 |
| JP | 2011065737 A | 3/2011 |
| JP | 2012504840 A | 2/2012 |
| JP | 2012505551 A | 3/2012 |
| JP | 2012089567 A | 5/2012 |
| JP | 2012533195 A | 12/2012 |
| KR | 20090051206 A | 5/2009 |
| KR | 20110014248 A | 2/2011 |
| TW | 382820 B | 2/2000 |
| TW | 434887 B | 5/2001 |
| TW | 476962 B | 2/2002 |
| TW | 200625635 A | 7/2006 |
| WO | 03/034498 A1 | 4/2003 |
| WO | 2005124787 A2 | 12/2005 |
| WO | 2009005699 A1 | 1/2009 |
| WO | 2010026654 A1 | 3/2010 |
| WO | 2010042354 A1 | 4/2010 |
| WO | 2010042732 A2 | 4/2010 |
| WO | 2011005266 A1 | 1/2011 |
| WO | 2011008654 A1 | 1/2011 |
| WO | 2011133138 A1 | 10/2011 |

OTHER PUBLICATIONS

Chinese Office Action mailed on Sep. 1, 2016 for Chinese Application No. 201380027469.8, 8 pages (including translation).
Notice of Allowance dated Oct. 5, 2016 for U.S. Appl. No. 14/887,050, 113 pages.
Notice of Allowance dated Oct. 7, 2016 for U.S. Appl. No. 14/213,953, 43 pages.
Notice of Allowance for U.S. Appl. No. 14/509,967 dated Oct. 24, 2016, 42 pages.
Notice of Allowance for U.S. Appl. No. 14/383,079 dated Aug. 17, 2016, 71 pages.
Notice of Allowance for U.S. Appl. No. 14/611,022 dated Oct. 26, 2016, 41 pages.
Notice of Allowance for U.S. Appl. No. 13/952,467 dated Sep. 28, 2016, 128 pages.
Notice of Allowance for U.S. Appl. No. 15/046,172 dated Oct. 4, 2016, 116 pages.
Notice of Allowance for U.S. Appl. No. 14/612,025 dated Oct. 19, 2016, 108 pages.
Office Action for U.S. Appl. No. 14/597,151 dated Oct. 20, 2016, 52 pages.
Office Action for U.S Appl. No. 14/588,136 dated Nov. 2, 2016, 132 pages.
International Search Report and Written Opinion for Application No. PCT/US2011/040362, mailed on Jan. 19, 2012, 7 pages.
International Search Report and Written Opinion for Application No. PCT/US2011/046035, mailed on Mar. 27, 2012, 6 pages.
International Search Report and Written Opinion for Application No. PCT/US2012/040232, mailed on Feb. 26, 2013, 7 pages.
International Search Report and Written Opinion for Application No. PCT/US2012/040242, mailed on Jan. 31, 2013, 9 pages.
International Search Report and Written Opinion for Application No. PCT/US2012/044077, mailed on Jan. 25, 2013, 9 pages.
International Search Report and Written Opinion for Application No. PCT/US2012/045312, mailed on Mar. 29, 2013, 11 pages.
International Search Report and Written Opinion for Application No. PCT/US2013/042746, mailed on Sep. 6, 2013, 7 pages.
International Search Report and Written Opinion for Application No. PCT/US2013/054976, mailed on Dec. 16, 2013, 9 pages.
International Search Report and Written Opinion for Application No. PCT/US2013/061244, mailed on Jan. 28, 2014, 8 pages.
International Search Report and Written Opinion for Application No. PCT/US2013/077628, mailed on Apr. 29, 2014, 12 pages.
International Search Report for Application No. PCT/US2009/060023, mailed on May 18, 2010, 3 pages.

(56) References Cited

OTHER PUBLICATIONS

International Search Report for Application No. PCT/US2009/061249, mailed on May 19, 2010, 3 pages.
International Search Report for Application No. PCT/US2011/040090, mailed on Feb. 17, 2012, 5 pages.
International Search Report for Application No. PCT/US2011/045124, mailed on May 29, 2012, 3 pages.
International Search Report for Application No. PCT/US2011/046036, mailed on Feb. 23, 2012, 3 pages.
Jafar M., et al., "Switching in Amorphous-silicon Devices," Physical Review, 1994, vol. 49 (19), pp. 611-615.
Japanese Office Action (English Translation) for Japanese Application No. 2011-153349 mailed Feb. 24, 2015, 3 pages.
Japanese Office Action (English Translation) for Japanese Application No. 2013-525926 mailed Mar. 3, 2015, 4 pages.
Japanese Office Action (English Translation) for Japanese Application No. 2014-513700 mailed Jan. 12, 2016, 4 pages.
Japanese Search Report (English Translation) for Japanese Application No. 2013-525926 dated Feb. 9, 2015, 15 pages.
Japanese Search Report (English Translation) for Japanese Application No. 2011-153349 dated Feb. 9, 2015, 11 pages.
Japanese Search Report (English Translation) for Japanese Application No. 2014-513700 dated Jan. 14, 2016, 25 pages.
Jo S.H. et al., "High-Density Crossbar Arrays Based on a Si Memristive System", Supporting Information, 2009, pp. 1-4.
Jo S.H., et al., "A Silicon-Based Crossbar Ultra-High-Density Non-Volatile Memory", SSEL Annual Report, 2007.
Jo S.H., et al., "Ag/a-Si:H/c-Si Resistive Switching Nonvolatile Memory Devices," Nanotechnology Materials and Devices Conference, 2006, vol. 1, pp. 116-117.
Jo S.H., et al., "CMOS Compatible Nanoscale Nonvolatile Resistance Switching Memory," Nano Letters, 2008, vol. 8 (2), pp. 392-397.
Jo S.H., et al., "Experimental, Modeling and Simulation Studies of Nanoscale Resistance Switching Devices", 9.sup.th Conference on Nanotechnology, IEEE, 2009, pp. 493-495.
Jo S.H., et al., "High-Density Crossbar Arrays Based on a Si Memristive System," Nano Letters, 2009, vol. 9 (2), pp. 870-874.
Jo S.H., et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H., et al., "Nonvolatile Resistive Switching Devices Based on Nanoscale Metal/Amorphous Silicon/Crystalline Silicon Junctions," Materials Research Society Symposium Proceedings, 2007, vol. 997.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Kuk-H Wan Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram (cbram): An Emerging Non-volatile Memory Technology Scalable to Sub 20nm", IEEE, 2005.
Le Comber P.G., et al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N17International Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008.
Marand H., et al., MESc. 5025 lecture notes: Chapter 7. Diffusion, University of Vermont. Retrieved from the Internet on Sep. 9, 2016. https://www.yumpu.com/en/document/view/31750386/diffusion-1-color.
Moopenn A. et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Notice of Allowance dated Dec. 19, 2014 for U.S. Appl. No. 13/529,985, 9 pgs.
Notice of Allowance dated Jul. 1, 2016 for U.S. Appl. No.. 14/213,953, 96 pages.
Notice of Allowance dated Jul. 17, 2014 for U.S. Appl. No. 12/861,432, 25 pages.
Notice of Allowance dated Aug. 28, 2015 for U.S. Appl. No. 14/573,770, 23 pages.
Notice of Allowance for U.S. Appl. No. 14/509,967 dated Feb. 17, 2016, 18 pages.
Notice of Allowance for U.S. Appl. No. 14/509,967 dated Jun. 6, 2016, 96 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance for U.S. Appl. No. 14/612,025 dated Jul. 22, 2015, 25 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Sep. 4, 2014 for U.S. Appl. No. 13/761,132, filed Feb. 6, 2013.
Notice of Allowance mailed Oct. 5, 2011 for U.S. Appl. No. 12/940,920, filed Nov. 5, 2010.
Notice of Allowance mailed Feb. 6, 2012 for U.S. Appl. No. 12/835,699, filed Jul. 13, 2010.
Notice of Allowance mailed Feb. 6, 2013 for U.S. Appl. No. 13/118,258, filed May 27, 2011.

(56) References Cited

OTHER PUBLICATIONS

Notice of Allowance mailed Aug. 8, 2013 for U.S. Appl. No. 13/733,828, filed Jan. 3, 2013.
Notice of Allowance mailed Jan. 8, 2013 for U.S. Appl. No. 12/814,410, filed Jun. 11, 2010.
Notice of Allowance mailed Oct. 8, 2013 for U.S. Appl. No. 13/769,152, filed Feb. 15, 2013.
Notice of Allowance mailed Oct. 8, 2013 for U.S. Appl. No. 13/905,074, filed May 29, 2013.
Notice of Allowance mailed Apr. 9, 2013 for U.S. Appl. No. 13/748,490, filed Jan. 23, 2013.
Notice of Allowance mailed Sep. 9, 2014 for U.S. Appl. No. 13/620,012, filed Sep. 14, 2012.
Notice of Allowance mailed Sep. 9, 2014 for U.S. Appl. No. 13/870,919, filed Apr. 25, 2013.
Notice of Allowance mailed Jan. 11, 2016 for U.S. Appl. No. 14/613,299.
Notice of Allowance mailed Jan. 20, 2016 for U.S. Appl. No. 14/034,390.
Notice of Allowance mailed Oct. 10, 2013 for U.S. Appl. No. 13/452,657, filed Apr. 20, 2012.
Notice of Allowance mailed Jan. 11, 2013 for U.S. Appl. No. 12/894,087 filed Sep. 29, 2010.
Notice of Allowance mailed May 11, 2012 for U.S. Appl. No. 12/939,824, filed Nov. 4, 2010.
Notice of Allowance mailed Mar. 12, 2012 for U.S. Appl. No. 12/913,719, filed Oct. 27, 2010.
Notice of Allowance mailed Nov. 13, 2013 for U.S. Appl. No. 13/461,725, filed May 1, 2012.
Notice of Allowance mailed Nov. 14, 2012 for U.S. Appl. No. 12/861,666, filed Aug. 23, 2010.
Notice of Allowance mailed Nov. 14, 2012 for U.S. Appl. No. 13/532,019, filed Jun. 25, 2012.
Notice of Allowance mailed Mar. 15, 2013 for U.S. Appl. No. 12/894,098, filed Sep. 29, 2010.
Notice of Allowance mailed Jan. 16, 2014 for U.S. Appl. No. 13/921,157, filed Jun. 18, 2013.
Notice of Allowance mailed Oct. 16, 2013 for U.S. Appl. No. 13/174,264, filed Jun. 30, 2011.
Notice of Allowance mailed Apr. 17, 2012 for U.S. Appl. No. 13/158,231, filed Jun. 10, 2011.
Notice of Allowance mailed Jan. 17, 2014 for U.S. Appl. No. 13/725,331, filed Dec. 21, 2012.
Notice of Allowance mailed Mar. 17, 2014 for U.S. Appl. No. 13/592,224, filed Aug. 22, 2012.
Notice of Allowance mailed May 17, 2013 for U.S. Appl. No. 13/290,024.
Notice of Allowance mailed Sep. 17, 2013 for U.S. Appl. No. 13/679,976, filed Nov. 16, 2012.
Notice of Allowance mailed Sep. 17, 2014 for U.S. Appl. No. 13/960,735, filed Aug. 6, 2013.
Notice of Allowance mailed Sep. 17, 2014 for U.S. Appl. No. 13/462,653, filed May 2, 2012.
Notice of Allowance mailed Sep. 18, 2012 for U.S. Appl. No. 12/900,232, filed Oct. 7, 2010.
Notice of Allowance mailed Sep. 18, 2014 for U.S. Appl. No. 13/920,021, filed Jun. 17, 2013.
Notice of Allowance mailed Sep. 18, 2014 for U.S. Appl. No. 13/586,815, filed Aug. 15, 2012.
Notice of Allowance mailed Jun. 19, 2012 for U.S. Appl. No. 12/861,650, filed Aug. 23, 2010.
Notice of Allowance mailed Sep. 19, 2013 for U.S. Appl. No. 13/585,759, filed Aug. 14, 2012.
Notice of Allowance mailed Apr. 2, 2013 for U.S. Appl. No. 13/149,757, filed May 31, 2011.
Notice of Allowance mailed Feb. 10, 2015 for U.S. Appl. No. 13/525,096, filed Jun. 15, 2012.
Notice of Allowance mailed Feb. 20, 2014 for U.S. Appl. No. 13/468,201, filed May 10, 2012.
Notice of Allowance mailed Mar. 20, 2014 for U.S. Appl. No. 13/598,550, filed Aug. 29, 2012.
Notice of Allowance mailed Mar. 20, 2014 for U.S. Appl. No. 13/461,725, filed May 1, 2012.
Notice of Allowance mailed Oct. 21, 2011 for U.S. Appl. No. 12/582,086, filed Oct. 20, 2009.
Notice of Allowance mailed Oct. 21, 2014 for U.S. Appl. No. 13/426,869, filed Mar. 22, 2012.
Notice of Allowance mailed May 22, 2012 for U.S. Appl. No. 12/815,369, filed Jun. 14, 2010.
Notice of Allowance mailed Dec. 23, 2015 for U.S. Appl. No. 14/573,770.
Notice of Allowance mailed Oct. 23, 2013 for U.S. Appl. No. 13/417,135, filed Mar. 9, 2012.
Notice of Allowance mailed Jan. 24, 2013 for U.S. Appl. No. 13/314,513, filed Dec. 8, 2011.
Notice of Allowance mailed Jul. 24, 2012 for U.S. Appl. No. 12/939,824, filed Nov. 4, 2010.
Notice of Allowance mailed Oct. 25, 2012 for U.S. Appl. No. 12/894,087, filed Sep. 29, 2010.
Notice of Allowance mailed Sep. 25, 2014 for U.S. Appl. No. 13/447,036, filed Apr. 13, 2012.
Notice of Allowance mailed Sep. 26, 2014 for U.S. Appl. No. 13/594,665, filed Aug. 24, 2012.
Notice of Allowance mailed Aug. 27, 2014 for U.S. Appl. No. 13/077,941, filed Mar. 31, 2011.
Notice of Allowance mailed Nov. 28, 2012 for U.S. Appl. No. 13/290,024, filed Nov. 4, 2011.
Notice of Allowance mailed Oct. 28, 2013 for U.S. Appl. No. 13/194,500, filed Jul. 29, 2011.
Notice of Allowance mailed Oct. 28, 2013 for U.S. Appl. No. 13/651,169, filed Oct. 12, 2012.
Notice of Allowance mailed Nov. 29, 2012 for U.S. Appl. No. 12/815,318, filed Jun. 14, 2010.
Notice of Allowance mailed Oct. 29, 2012 for U.S. Appl. No. 13/149,807, filed May 31, 2011.
Notice of Allowance mailed May 30, 2012 for U.S. Appl. No. 12/833,898, filed Jul. 9, 2010.
Notice of Allowance mailed Sep. 30, 2013 for U.S. Appl. No. 13/481,696, filed May 25, 2012.
Notice of Allowance mailed Aug. 31, 2012 for U.S. Appl. No. 13/051,296, filed Mar. 18, 2011.
Notice of Allowance mailed Apr. 20, 2016 for U.S. Appl. No. 14/573,817.
Notice of Allowance mailed Oct. 8, 2014 for U.S. Appl. No. 13/077,941, filed Mar. 31, 2011.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for U.S. Appl. No. 14/611,022 dated May 7, 2015, 13 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Notice of Allowance dated Sep. 14, 2016 for U.S. Appl. No. 14/588,202, 119 pages.
Office Action dated Aug. 23, 2016 for U.S. Appl. No. 14/613,585, 9 pages.
Zankovych S., et al., "Nanoimprint Lithography: Challenges and Prospects," Nanotechnology, 2001, vol. 12, pp. 91-95.

(56) References Cited

OTHER PUBLICATIONS

Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Office Action mailed Mar. 17, 2015 for U.S. Appl. No. 14/573,770.
Office Action mailed Apr. 19, 2011 for U.S. Appl. No. 12/582,086, filed Oct. 20, 2009.
Office Action mailed Aug. 19, 2013 for U.S. Appl. No. 13/585,759, filed Aug. 14, 2012.
Office Action mailed Jun. 19, 2012 for U.S. Appl. No. 13/149,757, filed May 31, 2011.
Office Action mailed Mar. 19, 2013 for U.S. Appl. No. 13/465,188, filed May 7, 2012.
Office Action mailed Mar. 19, 2013 for U.S. Appl. No. 13/564,639, filed Aug. 1, 2012.
Office Action mailed May 20, 2013 for U.S. Appl. No. 13/725,331, filed Dec. 21, 2012.
Office Action mailed Nov. 20, 2012 for U.S. Appl. No. 13/149,653, filed May 31, 2011.
Office Action mailed Sep. 20, 2013 for U.S. Appl. No. 13/481,600, filed May 25, 2012.
Office Action mailed Mar. 21, 2014 for U.S. Appl. No. 13/447,036, filed Apr. 13, 2012.
Office Action mailed May 21, 2014 for U.S. Appl. No. 13/764,698, filed Feb. 11, 2013.
Office Action mailed Sep. 21, 2011 for U.S. Appl. No. 12/835,704, filed Jul. 13, 2010.
Office Action mailed Jul. 22, 2010 for U.S. Appl. No. 11/875,541, filed Oct. 19, 2007.
Office Action mailed Jul. 22, 2011 for U.S. Appl. No. 12/913,719, filed Oct. 27, 2010.
Office Action mailed Sep. 22, 2013 for U.S. Appl. No. 13/189,401, filed Jul. 22, 2011.
Office Action mailed May 23, 2013 for U.S. Appl. No. 13/592,224, filed Aug. 22, 2012.
Office Action mailed Aug. 24, 2011 for U.S. Appl. No. 12/835,699, filed Jul. 13, 2010.
Office Action mailed Apr. 25, 2012 for U.S. Appl. No. 13/149,653, filed May 31, 2011.
Office Action mailed Apr. 25, 2014 for U.S. Appl. No. 13/761,132, filed Feb. 6, 2013.
Office Action mailed Jan. 25, 2012 for U.S. Appl. No. 12/861,650, filed Aug. 23, 2010.
Office Action mailed Oct. 25, 2012 for U.S. Appl. No. 13/461,725, filed May 1, 2012.
Office Action mailed Sep. 25, 2013 for U.S. Appl. No. 13/194,479, filed Jul. 29, 2011.
Office Action mailed Nov. 26, 2012 for U.S. Appl. No. 13/156,232.
Office Action mailed Aug. 27, 2013 for U.S. Appl. No. 13/436,714, filed Mar. 30, 2012.
Office Action mailed Dec. 27, 2013 for U.S. Appl. No. 13/525,096, filed Jun. 15, 2012.
Office Action mailed Mar. 27, 2012 for U.S. Appl. No. 13/314,513, filed Dec. 8, 2011.
Office Action mailed Jan. 29, 2014 for U.S. Appl. No. 13/586,815, filed Aug. 15, 2012.
Office Action mailed Jul. 29, 2013 for U.S. Appl. No. 13/466,008, filed May 7, 2012.
Office Action mailed Mar. 29, 2013 for U.S. Appl. No. 12/861,432, filed Aug. 23, 2010.
Office Action mailed Jul. 30, 2012 for U.S. Appl. No. 12/900,232, filed Oct. 7, 2010.
Office Action mailed Jun. 30, 2014 for U.S. Appl. No. 13/531,449, filed Jun. 22, 2012.
Office Action mailed Mar. 30, 2011 for U.S. Appl. No. 11/875,541, filed Oct. 19, 2007.
Office Action mailed Sep. 30, 2013 for U.S. Appl. No.. 13/189,401, filed Jul. 22, 2011.
Office Action mailed Sep. 30, 2013 for U.S. Appl. No. 13/462,653, filed May 2, 2012.
Office Action mailed Apr. 8, 2016 for U.S. Appl. No. 14/573,770.
Office Action mailed May 20, 2016 for U.S. Appl. No. 14/613,299.
Office Action mailed Jul. 9, 2015 for U.S. Appl. No. 14/573,817.
Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 830-833.
Owen A.E., et al., "Memory Switching in Amorphous Silicon Devices," Journal of Non-Crystalline Solids, 1983, vol. 50-60 (Pt.2), pp. 1273-1280.
Owen A.E., et al., "New Amorphous-Silicon Electrically Programmable Nonvolatile Switching Device," Solid-State and Electron Devices, IEEE Proceedings, 1982, vol. 129 (Pt. 1), pp. 51-54.
Owen A.E., et al., "Switching in Amorphous Devices," International Journal of Electronics, 1992, vol. 73 (5), pp. 897-906.
Rose M.J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Scott J.C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), pp. 1077-1081.
Stikeman A., Polymer Memory—The Plastic Path to Better Data Storage, Technology Review, Sep. 2002, pp. 31. Retrieved from the Internet.
Suehle J.S., et al., "Temperature Dependence of Soft Breakdown and Wear-out in Sub-3 Nm Si02 Films", 38th Annual International Reliability Physics Symposium, San Jose, California, 2000, pp. 33-39.
Sune J., et al., "Nondestructive Multiple Breakdown Events in Very Thin Si02 Films," Applied Physics Letters, 1989, vol. 55, pp. 128-130.
Terabe K., et al., "Quantized Conductance Atomic Switch," Nature, 2005, vol. 433, pp. 47-50.
Waser R., et al., "Nanoionics-based Resistive Switching Memories," Nature Materials, 2007, vol. 6, pp. 833-835.
Written Opinion for Application No. PCT/US2009/060023, mailed on May 18, 2010, 3 pages.
Written Opinion for Application No. PCT/US2009/061249, mailed on May 19, 2010, 3 pages.
Written Opinion for Application No. PCT/US2011/040090, mailed on Feb. 17, 2012, 6 pages.
Written Opinion for Application No. PCT/US2011/045124, mailed on May 29, 2012, 5 pages.
Written Opinion for Application No. PCT/US2011/046036, mailed on Feb. 23, 2012, 4 pages.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet.
Yuan H.C., et al., "Silicon Solar Cells with Front Hetero-Contact and Aluminum Alloy Back Junction", NREL conference Paper CP-520-42566, 33rd IEEE Photovoltaic Specialists Conference, May 11-16, 2008, National Renewable Energy Laboratory, San Diego, California.

(56) References Cited

OTHER PUBLICATIONS

Office Action for U.S. Appl. No. 14/887,050 dated Mar. 11, 2016, 12 pages.
Office Action for U.S. Appl. No. 15/046,172 dated Apr. 20, 2016, 8 pages.
Office Action mailed Apr. 1, 2013 for U.S. Appl. No. 13/174,077, filed Jun. 30, 2011.
Office Action mailed Aug. 1, 2012 for U.S. Appl. No. 12/894,098, filed Sep. 29, 2010.
Office Action mailed Mar. 1, 2012 for U.S. Appl. No. 12/835,704, filed Jul. 13, 2010.
Office Action mailed Aug. 2, 2013 for U.S. Appl. No. 13/594,665, filed Aug. 24, 2012.
Office Action mailed Sep. 2, 2014 for U.S. Appl. No. 13/705,082, 41 pages.
Office Action mailed Apr. 3, 2014 for U.S. Appl. No. 13/870,919, filed Apr. 25, 2013.
Office Action mailed Oct. 3, 2013 for U.S. Appl. No. 13/921,157, filed Jun. 18, 2013.
Office Action mailed Apr. 5, 2012 for U.S. Appl. No. 12/833,898, filed Jul. 9, 2010.
Office Action mailed Oct. 5, 2011 for U.S. Appl. No. 11/875,541, filed Oct. 19, 2007.
Office Action mailed Apr. 6, 2015 for U.S. Appl. No. 14/034,390, filed Sep. 23, 2013.
Office Action mailed Dec. 6, 2013 for U.S. Appl. No. 13/564,639, filed Aug. 1, 2012.
Office Action mailed Dec. 6, 2013 for U.S. Appl. No. 13/960,735, filed Aug. 6, 2013.
Office Action mailed Feb. 6, 2014 for U.S. Appl. No. 13/434,567, filed Mar. 29, 2012.
Office Action mailed Mar. 6, 2013 for U.S. Appl. No. 13/174,264, filed Jun. 30, 2011.
Office Action mailed Mar. 6, 2013 for U.S. Appl. No. 13/679,976, filed Nov. 16, 2012.
Office Action mailed Sep. 6, 2011 for U.S. Appl. No. 12/582,086, filed Oct. 20, 2009.
Office Action mailed Dec. 7, 2012 for U.S. Appl. No. 13/436,714, filed Mar. 30, 2012.
Office Action mailed Mar. 7, 2013 for U.S. Appl. No. 13/651,169, filed Oct. 12, 2012.
Office Action mailed May 7, 2013 for U.S. Appl. No. 13/585,759, filed Aug. 14, 2012.
Office Action mailed Jan. 8, 2014 for U.S. Appl. No. 12/861,432, filed Aug. 23, 2010.
Office Action mailed Jun. 8, 2012 for U.S. Appl. No. 11/875,541, filed Oct. 19, 2007.
Office Action mailed Aug. 9, 2013 for U.S. Appl. No. 13/764,710, filed Feb. 11, 2013.
Office Action mailed Jul. 9, 2013 for U.S. Appl. No. 13/447,036, filed Apr. 13, 2012.
Office Action mailed Jul. 9, 2014 for U.S. Appl. No. 14/166,691, filed Jan. 28, 2014.
Office Action mailed Oct. 9, 2012 for U.S. Appl. No. 13/417,135, filed Mar. 9, 2012.
Office Action mailed Jan. 10, 2014 for U.S. Appl. No. 13/920,021, filed Jun. 17, 2013.
Office Action mailed Apr. 11, 2014 for U.S. Appl. No. 13/143,047, filed Jun. 30, 2011.
Office Action mailed Feb. 11, 2014 for U.S. Appl. No. 13/620,012, filed Sep. 14, 2012.
Office Action mailed Jul. 11, 2013 for U.S. Appl. No. 13/764,698, filed Feb. 11, 2013.
Office Action mailed Sep. 11, 2014 for U.S. Appl. No. 13/739,283, filed Jan. 11, 2013.
Office Action mailed Aug. 12, 2013 for U.S. Appl. No. 13/077,941 filed Mar. 31, 2011.
Office Action dated Aug. 12, 2016 for U.S. Appl. No. 14/667,346, 27 pages.
Office Action mailed Mar. 12, 2014 for U.S. Appl. No. 13/167,920, filed Jun. 24, 2011.
Office Action mailed Sep. 12, 2014 for U.S. Appl. No. 13/426,869, filed Mar. 22, 2012.
Office Action mailed Sep. 12, 2014 for U.S. Appl. No. 13/756,498.
Office Action mailed Dec. 3, 2015 for U.S. Appl. No. 14/253,796.
Office Action mailed Feb. 13, 2014 for U.S. Appl. No. 13/174,077, filed Jun. 30, 2011.
Office Action dated Aug. 12, 2016 for U.S. Appl. No. 14/613,301, 43 pages.
Office Action mailed Mar. 14, 2012 for U.S. Appl. No. 12/815,369, filed Jun. 14, 2010.
Office Action mailed Mar. 14, 2014 for U.S. Appl. No.. 12/835,704, filed Jul. 13, 2010.
Office Action mailed Apr. 15, 2016 for U.S. Appl. No. 14/597,151.
Office Action mailed Apr. 16, 2012 for U.S. Appl. No. 12/834,610, filed Jul. 12, 2010.
Office Action mailed Jan. 16, 2014 for U.S. Appl. No. 13/739,283, filed Jan. 11, 2013.
Office Action mailed May 16, 2012 for U.S. Appl. No. 12/815,318, filed Jun. 14, 2010.
Office Action mailed Oct. 16, 2012 for U.S. Appl. No. 12/861,650, filed Aug. 23, 2010.
Office Action mailed Apr. 17, 2012 for U.S. Appl. No. 12/814,410, filed Jun. 11, 2010.
Office Action mailed Feb. 17, 2011 for U.S. Appl. No. 12/913,719, filed Oct. 27, 2010.
Office Action mailed Jun. 17, 2014 for U.S. Appl. No. 14/072,657, filed Nov. 5, 2013.
Notice of Allowance for U.S. Appl. No. 14/692,677 dated Nov. 21, 2016, 97 pages.
Corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.
Advisory Action mailed Jun. 8, 2012 for U.S. Appl. No. 12/835,704, filed Jul. 13, 2010.
Avila A., et al., "Switching in Coplanar Amorphous Hydrogenated Silicon Devices," Solid-State Electronics, 2000, vol. 14 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., at al., "Aluminum Spiking at Contact Windows in Al/Ti—W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 6 pages.
Chinese Office Action (English Translation) for Chinese Application No 201110195933.7 dated Jul. 31, 2014, 4 pages.
Chinese Office Action (English Translation) for Chinese Application No 201110195933.7 dated May 18, 2015, 4 pages.
Chinese Office Action (English Translation) for Chinese Application No 201180050941.0 dated Dec. 9, 2015, 5 pages.
Chinese Office Action (with English Translation) for Chinese Application No. 201280027066.9 mailed on Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application no. 201180050941.0 dated Mar. 25, 2015, 1 page.
Chinese Search Report (English Translation) for Chinese Application No. 201280027066.9 dated Nov. 13, 2015, 2 pages.
Choi J.W., "Bistable [2]Rotaxane Based Molecular Electronics: Fundamentals and Applications", Dissertation, Chapter 3, California Institute of Technology, Pasadena, 2007, pp. 79-120. Retrieved from the Internet.

(56) References Cited

OTHER PUBLICATIONS

Thou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-395.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
Corrected Notice of Allowability mailed Oct. 1, 2013 for U.S. Appl. No. 13/733,828, filed Jan. 3, 2013.
Corrected Notice of Allowance mailed Jan. 11, 2013 for U.S. Appl. No. 12/861,666 dated Aug. 23, 2010.
Dehon A., "Array-Based Architecture for FET-Based, Nanoscale Electronics," IEEE Transactions on Nanotechnology, 2003, vol. 2 (1), pp. 23-32.
Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 312-813.
Dey S.K., "Electrothermal Model of Switching in Amorphous Silicon Films," Journal of Vacuum Science & Technology, 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Office Action for Application No. 11005649.6 dated Dec. 1, 2014, 2 pages.
European Office Action for Application No. 11005649.6 dated Nov. 17, 2015, 5 pages.
European Office Action for Application No. EP11005207.3 dated Aug. 8, 2012, 4 pages.
European Search Report for Application No. EP09819890.6 mailed on Mar. 27, 2012.
European Search Report for Application No. EP11005207.3 mailed on Oct. 12, 2011.
European Search Report for Application No. EP14000949, mailed on Jun. 4, 2014, 7 pages.
European Search Report for European Application No. EP11005649 mailed Oct. 15, 2014, 2 pages.
Ex parte Quayle Action mailed May 8, 2012 for U.S. Appl. No. 12/826,653, filed Jun. 29, 2010.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096, filed Jun. 15, 2012.
Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H., et al., High-Performance Emerging Solid-State Memory Technologies, MRS Bulletin, Nov. 2004, pp. 805-813. Retrieved from the Internet.
Hajto J., et al., "Electronic Switching in Amorphous-Semiconductor Thin Films," Amorphous & Microcrystalline Semiconductor Devices: Materials and Device Physics, Chapter 14, 1992, pp. 640-701, vol. 2, Artech House, Inc.
Hajto J., et al., "Analogue Memory and Ballistic Electron Effects in Metal-amorphous Silicon Structures," Philosophical Magazine, 1991, vol. 63 (1), pp. 349-369.
Hajto J., et al., "The Programmability of Amorphous Silicon Analogue Memory Elements," Materials Research Society Symposium Proceedings , 1990, vol. 192, pp. 405-410.
Holmes A.J., et al., "Design of Analogue Synapse Circuits using Non-Volatile a-Si:H Memory Devices", Proceedings of ISCAS, 1994, pp. 351-354.
Hu J., et al., "AC Characteristics of Cr/p.sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504-20090406, May 4, 2009, pp. 1-9.
Hu., et al., "Area-Dependent Switching in Thin Film-Silicon Devices," Materials Research Society Symposium Proceedings, 2003, vol. 762, pp. A 18.3.1-A 18.3.6.
Hu. et al. "Switching and Filament Formation in hot-wire CVD p-type a-Si:H devices," Thin Solid Films, Science Direct, 2003, vol. 430, pp. 249-252.
Hudgens S., et al., "Overview of Phase-Change Chalcogenide Nonvolatile Memory Technology", MRS Bulletin, Nov. 2004, pp. 829-832. Retrieved from the Internet.
Office Action for U.S. Appl. No. 14/667,346 dated Feb. 9, 2017, 29 pages.
Chinese Office Action for Chinese Application Serial No. 201280027066.9 dated Feb. 17, 2017, 9 pages (with English translation).
Taiwanese Office Action mailed on Dec. 6, 2016 for Taiwanese Application No. 102129266, 7 pages (with English translation).

\* cited by examiner

REDUCED DIFFUSION IN METAL ELECTRODE FOR TWO-TERMINAL MEMORY

CROSS-REFERENCE TO RELATED APPLICATIONS

The present application for patent is a non-provisional of and claims benefit of U.S. Provisional Application No. 61/786,113 filed Mar. 14, 2013. This application also claims priority to and is a continuation in part of U.S. patent application Ser. No. 13/447,036 filed Apr. 13, 2012. The instant application also claims priority to and is a continuation in part of PCT Application No. PCT/US13/54976 (A936SP-008000PC) filed Aug. 14, 2013, and is a continuation in part of U.S. patent application Ser. No. 14/034,390 (A936SP-008020US) filed Sep. 23, 2013, both of which are continuations of U.S. patent application Ser. No. 13/585,759 filed Aug. 14, 2012. All of the above stated applications are incorporated herein by reference in their respective entireties and for all purposes.

TECHNICAL FIELD

This disclosure relates generally to electronic memory; for example, the disclosure describes two-terminal memory that mitigates diffusion of external material within the two-terminal memory.

BACKGROUND

Success of semiconductor electronics has largely resulted from a great personal and commercial utility derived from high-speed electronic communications. Provision of these electronic communications, particularly on a global scale, involves the convergence of several factors: development of communication infrastructure to transport data, design of components and devices to initiate or facilitate communication and various applications thereof, and manufacturing techniques to fabricate these components. Massive demand for the utility of electronic communication has engendered an industry related to each of the factors. Infrastructure developers provide global networks to transport data and interpersonal communications, software developers provide applications, operating systems, and computing devices to access, manage and utilize the communications, component designers develop electronic components-processors, memory, etc.—to process and store the data, and fabrication facilities create the electronic components.

One reason for the persistent success of electronics is the variety and diversity of useful applications that develop from increases in speed and capacity of electronic components. In turn, the speed and capacity of such components is associated with an intensive transistor down-scaling process, in which smaller transistors have lead to increased storage capacity, and in some cases increased processing power. In recent years, components such as field effect transistors used for switches, memory cells, and other components of electronic devices have achieved sizes on the order of 100 nm. Even smaller such devices are theorized. The inventors of the present disclosure, however, believe that significant challenges will occur for sub-100 nm transistor components, including short channel effects, performance degradation, longevity problems, and so on.

Resistive memory devices represent a recent innovation within the field of integrated circuit technology. While much of this technology is in the development stages, various technological concepts for proposed resistive memory devices and fabrication of the same have been demonstrated by the inventors. The inventors believe that various resistive memory technologies and various techniques for fabricating various resistive memory devices show compelling evidence to hold substantial advantages over competing technologies in the semiconductor electronics industry.

Over time, advancement in technology has provided an increase in a number of semiconductor devices, such as transistors, that can be fabricated on a given geometric area of a semiconductor chip. An implication of increasing the number of semiconductor devices is increasing memory capacity and processing power for the semiconductor chip and associated electronic devices.

In light of the above, the inventors desire to continue developing practical utilization and fabrication of resistive memory technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the subject disclosure provide for two-terminal memory that mitigates diffusion of external material therein. In some embodiments, a two-terminal memory cell can comprise an electrode layer. The electrode layer can be at least in part permeable to an undesired element(s) or compound(s), such as oxygen or some other chemically reactive or non-inert material. The two-terminal memory can further comprise a diffusion mitigation material disposed between the electrode layer and external material. This diffusion mitigation material can be selected to mitigate or prevent diffusion of the undesired element(s) or compound(s), to mitigate or avoid exposure of the undesired element(s) or compound(s) to the electrode layer. Accordingly, degradation of the two-terminal memory as a result of contact with the undesired element(s) or compound(s) can be mitigated by various disclosed embodiments.

In a further embodiment, the present disclosure provides a memory cell arranged in a monolithic stack. The memory cell can comprise a bottom electrode comprising an electrically conductive material. Further, the memory cell can comprise a switching medium comprising an electrically resistive material and a top electrode comprising a noble metal that produces ions at a boundary of the top electrode and the switching medium in response to an electric field applied to the memory cell, wherein the switching medium is at least in part permeable to the ions. Furthermore, the memory cell can comprise a passivation layer comprising a non-noble metal disposed at an opposite side of the top electrode from the switching medium, wherein the passivation layer mitigates exposure of atmospheric gas to the top electrode.

In further embodiments, the present disclosure provides a method of fabricating a memory cell. The method can comprise forming a first electrically conductive electrode layer above a substrate material and forming an electrically resistive switching medium above the first conductive electrode layer that is permeable to ions of at least one noble metal. Additionally, the method can comprise forming a second electrically conductive electrode layer comprising the at least one noble metal above the electrically resistive switching medium and forming a diffusion mitigation layer comprising a non-noble metal above the second electrically conductive electrode layer. Moreover, in various embodiments, the second electrically conductive electrode layer can be configured to generate ions at least at a surface closest to the electrically resistive switching medium in response to an electric field, the fabricating can be performed in a reduced oxygen environment, and the non-noble metal can be configured to mitigate exposure of the second electrically resistive switching medium to oxygen.

In still other aspects of the present disclosure, there is provided an electronic device. The electronic device can comprise an array of memory cells comprising a substrate having a complementary semiconductor metal oxide device and a two-terminal memory cell, both formed at least in part on or above the substrate, wherein the memory is configured to store instructions related to operating the electronic device. Further, the electronic device can comprise a command interface configured to receive an instruction pertaining to performing a memory operation with respect to the array of memory cells and a controller configured to execute the memory operation on the at least one two-terminal memory cell via one or more signal inputs in response to receipt of the instruction at the command interface and processing of the command. In various embodiments, the two-terminal memory cell can comprise a bottom electrode, a switching medium, a top electrode comprising a noble metal and a passivation layer comprising a non-noble metal in immediate contact with the top electrode. Moreover, the passivation layer can be configured to mitigate exposure of the top electrode to oxygen.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects, and advantages of the instant invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
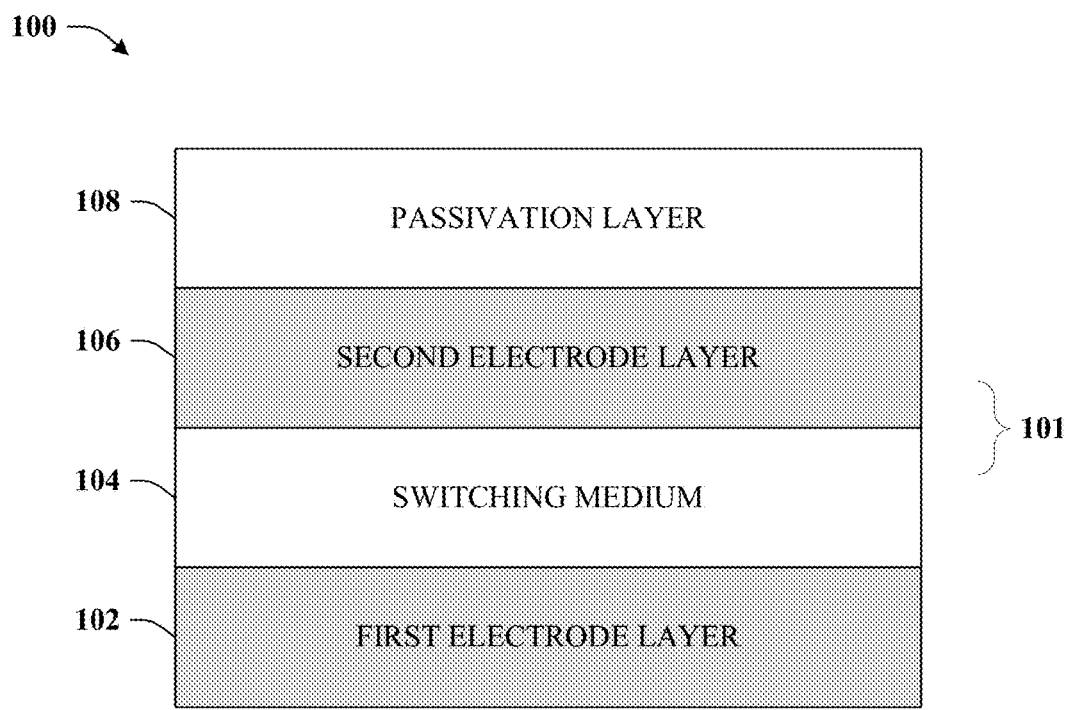
FIG. 1 illustrates a block diagram of an example two-terminal memory cell that mitigates diffusion of external material therein, in disclosed embodiments.

This disclosure relates to two-terminal memory cells employed for digital information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM), among others.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios, small on/off resistance ratios (e.g., leading to small sensing margin) or poor thermal stability, as well as other problems. Though resistive-switching memory technology is considered by the inventors to be one of the best technologies having the most benefits and least detriments, other two-terminal memory technologies can be utilized for some of the disclosed embodiments, where suitable to one of ordinary skill in the art.

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, etc.), a resistive switching layer (RSL) and an active metal layer capable of being ionized or generating ions (e.g., at a boundary of the RSL and the active metal layer). Under suitable conditions, e.g. application of a sufficient voltage, the active metal layer can provide filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), metallic oxide (e.g. Zinc Oxide) and so forth. Other examples of materials suitable for the RSL could include $Si_XGe_YO_Z$ (where X, Y and Z are respective suitable positive integers), a silicon oxide (e.g., $SiO_N$, where N is a suitable positive integer), amorphous Si (a-Si), amorphous SiGe (a-SiGe), $TaO_B$ (where B is a suitable positive integer), $HfO_C$ (where C is a suitable positive integer), $TiO_D$ (where D is a suitable positive integer), and so forth, or a suitable combination thereof. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing via joule heating) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

In at least some embodiments of the present disclosure, disclosed memory cell technologies can be employed for multi-programmable devices that can be programmed, erased, and re-programmed many times during a usable lifetime of the memory cell. Other embodiments can be employed for a one-time programmable memory device (e.g., employed in write-once-read-many applications), having some capacity to mitigate—or avoid entirely—the erasure of the memory device. Additionally, various embodiments disclose multi-state devices having measurably distinct electrical characteristics that define distinct digital information states; in at least some embodiments, the multi-state devices can be characterized by non-linear current-voltage relationships that facilitate operating the multi-state device (e.g., program operation, erase operation, read operation, etc.).

Referring now to the drawings, FIG. 1 illustrates a block diagram of an example two-terminal memory cell 100 configured to resist diffusion of external material within memory cell 100. As depicted, memory cell 100 can comprise a first electrode layer 102 and a second electrode layer 106. First electrode layer 102 and second electrode layer 106 can serve as contact points, in various embodiments, for applying an operational signal to memory cell 100. First electrode layer 102 and second electrode layer 106 can be electrical conductors, such as metals, doped conductive silicon or silicon compounds, and the like.

In some embodiments, memory cell 100 can be a resistive memory cell. Various two-terminal memory cell technologies can have distinct states defined by measurably distinct electrical or magnetic characteristic values. In the case of resistive memory, distinct states can be defined by measurably distinct resistance values of a switching medium 104. First electrode layer 102 or second electrode layer 106 can be an ion donor layer, configured to generate ions at a boundary to switching medium 104 in response to an electric field applied across memory cell 100. For example, second electrode layer 106 can generate ions at least at a boundary 101 of switching medium 104 and second electrode layer 106. Switching medium 104 can be a material that is electrically insulating, but also that is at least in part permeable to the ions. As ions migrate within switching medium 104 in response to the electric fields provided by the applied voltages, the electrical resistance of switching medium 104 can change in a measurable manner, providing at least one distinct resistance state.

One suitable material for second electrode layer 106 is a noble metal. Noble metals tend to generate ions in response to an electric field (e.g., at boundary 101 of switching medium 104 and second electrode layer 106), and thus can provide the basis to change electrical characteristics of switching medium 104. In various embodiments, absent an applied electric field, the metal ions become metal atoms (e.g., having no net charge) within switching medium 104 and their respective positions within switching medium 104 remain stable. However, noble metals are often permeable to external reactive materials. For instance, noble metals can often be permeable to oxygen. Thus, oxygen exposed to second switching layer 106 can migrate through second electrode layer 106, and contact switching medium 104 at boundary 101, resulting in oxidation of switching medium 104 at boundary 101. Oxidation can often affect electrical properties of a device, such as changing resistance, lowering conductivity, and furthermore current through an oxidized material can promote oxidation further, enhancing affects to the electrical properties of the device. In some circumstances, this can lead to degradation of memory cell 100, undermining longevity, endurance, memory retention, or other characteristics of memory cell 100.

To mitigate diffusion of external materials within memory cell 100, a passivation layer 108 can be provided above second material layer 106. Passivation layer 108 can be selected to mitigate diffusion of external materials (e.g., oxygen, reactive elements or compounds, and so forth) through passivation layer 108. Accordingly, passivation layer 108 can serve as a barrier to mitigate or avoid undesired materials from contacting second electrode layer 106, such as oxygen or other reactive materials.

In some embodiments, passivation layer 108 can be a non-noble metal. Though in the case of some non-noble metals oxidation may occur with respect to passivation layer 108, memory cell 100 can operate without being significantly affected by this oxidation of passivation layer 108. For instance, a field across second electrode layer 106 and first electrode layer 102 creates a series circuit comprising second electrode layer 106, switching medium 104, and first electrode layer 102, but excluding passivation layer 108. Accordingly, oxidation of passivation layer 108 will not directly affect electrical characteristics of this series circuit. Moreover, because passivation layer 108 mitigates diffusion of oxygen or other reactive materials through passivation layer 108, chemical or ionic degradation of second electrode layer 106, switching medium 104 or first electrode layer 102 can be mitigated or avoided. Accordingly, memory cell 100 can provide a memory cell that resists diffusion of undesired elements or compounds, enhancing longevity, endurance, memory retention, or the like, of memory cell 100.

Figure 2:
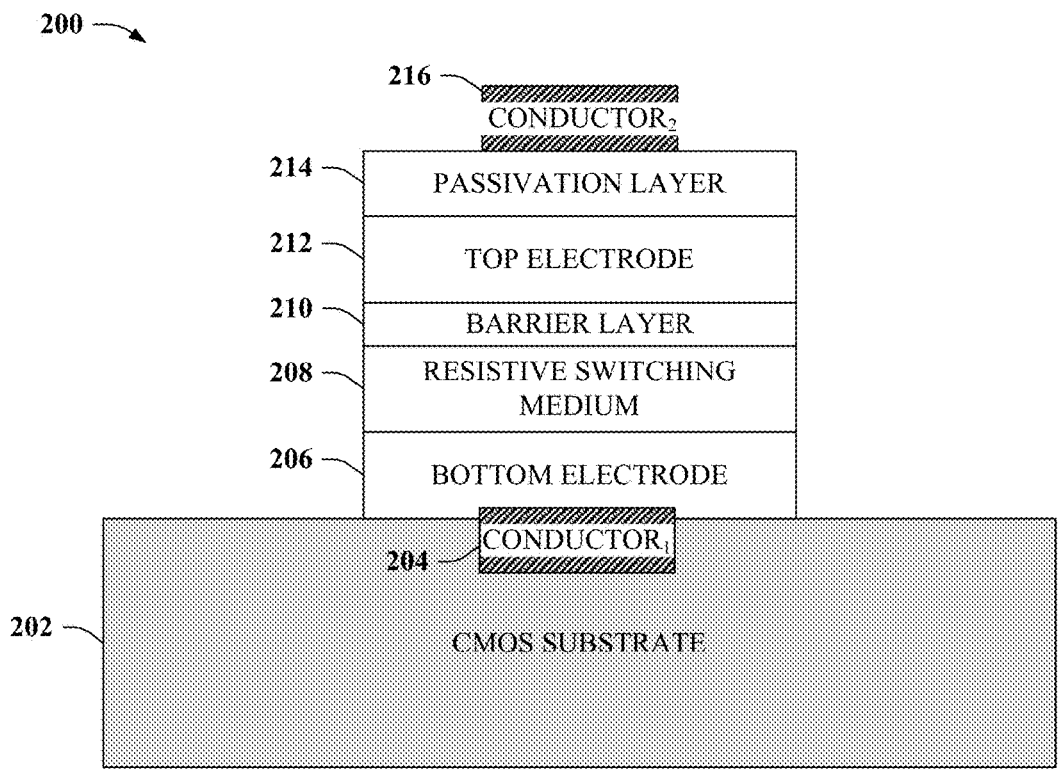
FIG. 2 depicts a block diagram of an example monolithic stack forming a memory cell that is resistant to external degradation, in further embodiments.

FIG. 2 depicts a block diagram of an example memory cell 200 comprising a monolithic stack of layers, in accordance with further embodiments of the present disclosure. Memory cell 200 can be formed on a substrate 202. Substrate 202 can be a silicon or silicon compound, in various embodiments. In further embodiments, substrate 202 can have one or more complementary metal-oxide semiconductor (CMOS) devices formed in or on substrate 202.

As depicted, a first conductor (e.g. wire) 204 can be formed on or at least partially in substrate 202. First conductor 204 can be a control line of an electronic memory array, in some embodiments, such as a wordline, a bitline, a data line, a source line, etc., of the electronic memory array. In further embodiments, first conductor 204 can be a conductive metal, a conductive doped silicon or silicon compound, or the like, or other suitable conductor. In still other embodiments, first conductor 204 may include a metal (e.g. aluminum, copper) and a conductive silicon compound (e.g. p-doped polysilicon, p-doped polycrystalline silicon germanium, or the like); one or more metals (e.g. aluminum, copper, Ti, TiN, W, TaN); or the like.

Further to the above, memory cell 200 can comprise a bottom electrode 206 formed in contact with first wire 204. Bottom electrode 206 can serve as a first electrical contact for memory cell 200, in conjunction with performing memory operations with respect to memory cell 200 (e.g., programming, erasing, reading, etc., memory cell 200). In various embodiments, bottom electrode 206 can be an electrical conductor (e.g., metal, doped silicon, etc.).

In addition to the foregoing, memory cell 200 can comprise a resistive switching medium 208 disposed above bottom electrode 206. Resistive switching medium 208 can be an electrical insulator. In addition to the foregoing, resistive switching medium 208 can be at least in part permeable to ions (e.g., metallic ions) generated by memory cell 200. Migration of ions within resistive switching medium 208 under application of an applied voltage can change electrical resistivity of resistive switching medium 208 in distinct and measurable manners, defining distinct digital states.

Memory cell 200 can additionally comprise a barrier layer 210 above resistive switching medium 208. Barrier layer 210 can be selected to control migration of ions into resistive switching medium 208 to control oxidation of resistive switching medium 208, or the like. In some embodiments, barrier layer 210 preferably oxidizes relative to resistive switching medium 208. In some embodiments, barrier layer 210 may include a non-noble metal such as titanium, titanium oxide, tungsten, or the like. In at least one embodiment, barrier layer 210 can have a thickness of about 10 nanometers (nm) or less. In further embodiments, barrier layer 210 can have a thickness in a range of about 3 nm to about 10 nm. In various embodiments, barrier layer 210 can be formed with a physical vapor deposition process.

A top electrode 212 can be above barrier layer 210. Top electrode 212 can be a noble metal, in some embodiments. In further embodiments, top electrode 212 can serve as a contact point for electrical operations of memory cell 200 (e.g., in conjunction with bottom electrode 206). Thus, according to various embodiments, a program signal, erase signal, read signal, etc., can be applied to top electrode 212 or bottom electrode 206 to facilitate programming, erasing or reading memory cell 200. Top electrode 212 can be selected to generate ions, within resistive switching medium 208, in response to an applied electric field. Upon application of a sufficiently large write voltage, the noble metal ions move toward the negative terminal, and when the voltage is reduced or not applied, the metal ions become metal atoms and resist further movement. In various embodiments, the metal atoms may form a metal filament within resistive switching medium 208 which changes the electrical resistivity of resistive switching medium 208.

Memory cell 200 can additionally comprise a passivation layer 214 and a second conductor 216. Passivation layer 214 can be a non-noble metal, in some embodiments. In further embodiments, passivation layer 214 can be selected to mitigate diffusion of additional external materials into or through passivation layer 214 (e.g. oxygen). For instance, passivation layer 214 can be selected to mitigate or prevent diffusion of oxygen or other chemically or ionically reactive materials into or through passivation layer 214. Accordingly, passivation layer 214 can reduce or avoid oxidation of layers of memory cell 200 below passivation layer 214 (e.g., resistive switching medium 208). Various embodiments improve operational integrity, including endurance, longevity, memory retention or the like, of memory cell 200. Second conductor 216 can be a second operation line of a memory array or electronic device, such as a wordline, dataline, bitline, source line, etc, of the memory array.

In some embodiments, top electrode 212 or bottom electrode 206 can comprise a noble metal material that produces free ions at an interface thereof (e.g., an interface of top electrode 212 and barrier layer 210, an interface of bottom electrode 206 and resistive switching medium 208, etc.) upon application of a write voltage or an erase voltage. In some embodiments, top electrode 212 or bottom electrode 206 can be elemental metals, ionically bonded metals (e.g. alloys), doped silicon or doped silicon compounds, or the like, or a suitable combination of the foregoing. Additionally, top electrode 212 or bottom electrode 206 can include an additional layer(s) (some very thin, e.g., 2 to 3 nm) such as Ti, TiN, W, TaN or the like, adjacent to top electrode 212 or bottom electrode 206.

In alternative or additional embodiments, one or more other layers can be included in memory cell 200. For instance, an intermediary layer(s) can be instituted adjacent to one or more of the layers depicted in FIG. 2. As one example, a suitable material layer that mitigates or controls unintended oxidation of resistive switching medium 208 can be positioned between one or more layers of memory cell 200, such as between top electrode 212 and resistive switching medium 208 (which can include barrier layer 210 or be separate from barrier layer 210). As another example, in some embodiments, memory cell 200 can have fewer layers than depicted in FIG. 2. For instance, top electrode 202 or bottom electrode 208 can be removed in such embodiments, and resistive switching material 208 can electrically contact a conductive wire of a memory array (e.g., first conductor 204). Accordingly, it is appreciated that suitable variations of memory cell 200 known in the art or made known to one of ordinary skill in the art by way of the context provided herein are considered within the scope of the present disclosure.

Figure 3:
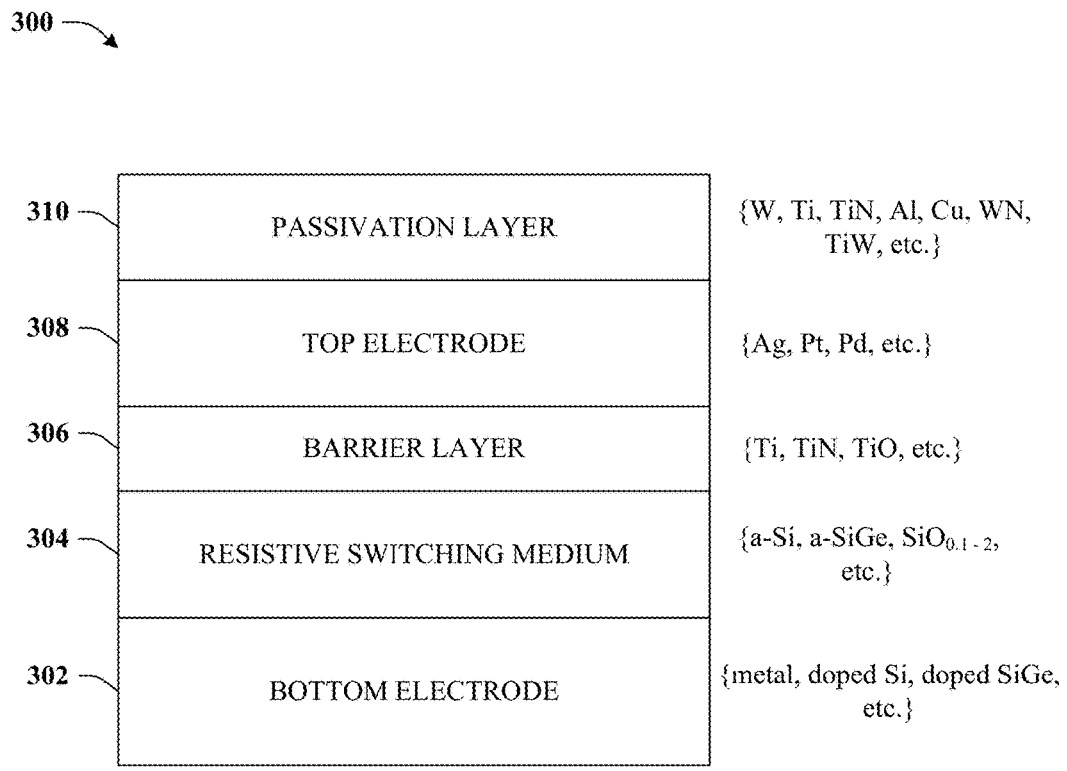
FIG. 3 illustrates a block diagram of an example two-terminal memory cell configured to mitigate oxidation of a resistive switching layer, in an embodiment(s)

FIG. 3 depicts a block diagram of an example memory cell 300 in one or more other aspects of the subject disclosure. Memory cell 300 can be a monolithic stack providing a two-terminal memory cell. Moreover, memory cell 300 can be configured to mitigate or avoid diffusion of contaminant material within at least a subset of memory cell 300.

Memory cell 300 can comprise a monolithic stack of layers formed above a CMOS substrate. The stack of layers can comprise a bottom electrode 302, a resistive switching medium 304, a barrier layer 306, a top electrode 308 and a passivation layer 310. Bottom electrode 302 can comprise a metal, a doped silicon (e.g., p-type silicon, p-type polysilicon, n-type silicon, etc.), a doped silicon germanium (e.g., p+ SiGe, and so forth), or other suitable doped silicon compound. Resistive switching medium 304 can be comprised of various materials or various layers of material. For example, resistive switching medium 304 can be any suitable material or switching medium having high electrical resistance and having at least partial permeability (e.g., in response to an electric signal) to ions of top electrode 308 or bottom electrode 302, or to ions generated within or at a boundary of resistive switching medium 304 (e.g., metal or oxygen ions). In addition, the material employed for resistive switching medium 304 can be compatible with semiconductor fabrication processes (e.g., stacking, etching, masking, deposition, etc.) including CMOS processes. Examples of such a material can include an undoped amorphous silicon (a-Si) material, a chalcogenide, a silicon on glass, an oxide such as titanium oxide ($TiO_x$), tantalum oxide ($TaO_x$), a silicon oxide (e.g., $SiO_x$) such as silicon dioxide ($SiO_2$), silicon sub-oxide (e.g., $SiO_x$, where $0<x\leq2$), Hafnium Oxide ($HfO_x$), Nickel Oxide ($NiO_x$), Tungsten Oxide ($WO_x$), Aluminum Oxide ($AlO_x$), Copper Oxide ($CuO_x$), Germanium Oxide ($GeO_x$), Silicon Germanium Oxide ($Si_xGe_ySe_z$), Silver Selenide ($Ag_2Se$), Copper Sulfite ($Cu_2S$), other oxide, or a suitable combination thereof, which is at least in part porous with respect to the particles, ions, or the like. In various embodiments, absent an applied voltage, resistive switching medium 304 does not include metallic ions.

In addition to the foregoing, barrier layer 306 can be selected to control migration of undesired ions into resistive switching medium 304, or generation of undesired ions between top electrode 308 and resistive switching medium 304. In various embodiments, barrier layer 306 can be formed to have a thickness suitable to moderate formation/flow of ions into resistive switching medium 304. In some embodiments, the thickness of barrier layer 306 can be 10 nm or less (e.g., a range of about 3 nm to about 10 nm). Examples of suitable materials for barrier layer 306 can comprise Ti, TiN, and TiO. Top electrode 308 can be a noble metal, in various embodiments. Examples of noble metals that can be employed for top electrode 308 can include Ag, Au, Pt, Pd, or the like.

Passivation layer 310 can be comprised of a non-noble metal. Examples can include W, a nitride of tungsten (e.g., WN, $W_2N$, $WN_2$, etc.), Ti, TiN, Al, TiW, Cu, or the like, or a suitable compound or combination thereof. W can be utilized, as an example, in conjunction with a reactive ion etch process employed, at least in part, for fabricating memory cell 300. Passivation layer 310 can be deposited in immediate contact to top electrode 308, in some embodiments. As an example, passivation layer 310 can be deposited with a physical vapor deposition (PVD) or a chemical vapor deposition (CVD). In one or more embodiments, passivation layer 310 can have a thickness in a range of about 10 nm to about 50 nm.

The aforementioned diagrams have been described with respect to several components (e.g., layers) of a memory cell, or memory operations associated with such memory cells. It should be appreciated that in some suitable alternative aspects of the subject disclosure, such diagrams can include those components and operations specified therein, some of the specified components/operations, or additional components/operations. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. In yet other embodiments, a disclosed memory stack or set of film layers can have fewer layers than depicted. For instance, a switching layer can electrically contact a conductive wire directly, rather than having an electrode layer or contact layer there between. Additionally, it is noted that one or more disclosed processes can be combined into a single process providing aggregate functionality. Components of the disclosed architectures can also interact with one or more other components not specifically described herein but known by those of skill in the art or made known to those of skill in the art by way of the context provided herein.

Figure 4:
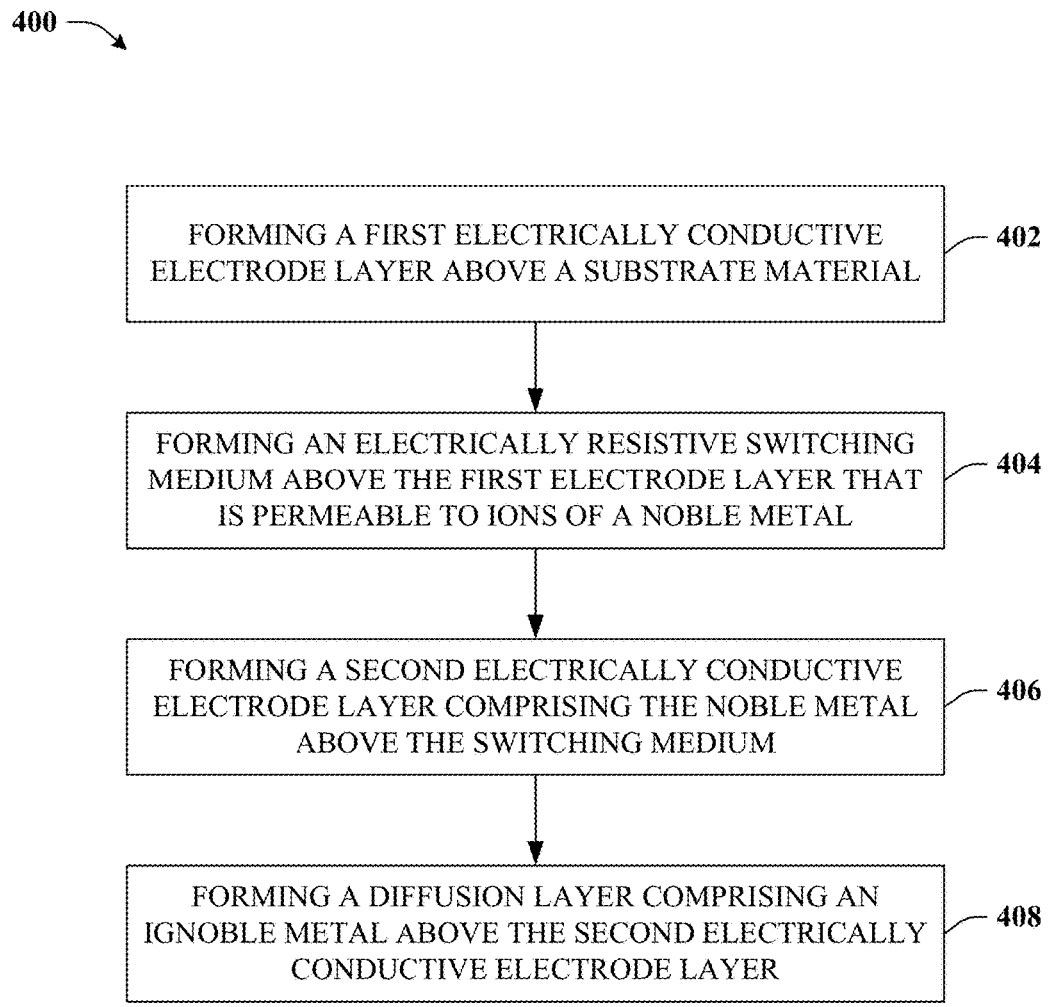
FIG. 4 depicts a flowchart of a sample method for fabricating a memory cell having resistance to diffusion of external material therein, in other embodiments.
Figure 5:
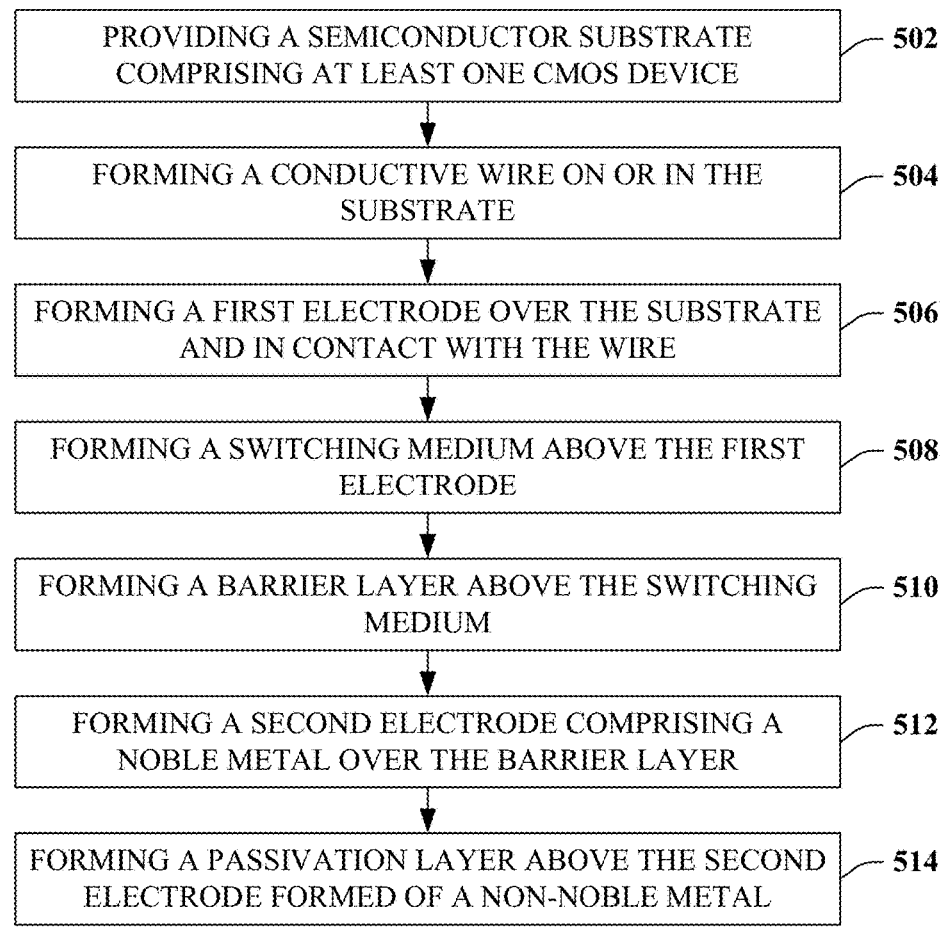
FIG. 5 illustrates a flowchart of a sample method for fabricating a memory cell that mitigates oxidation of a switching medium, in another embodiment(s)

In view of the exemplary diagrams described supra, process methods that can be implemented in accordance with the disclosed subject matter will be better appreciated with reference to the flow charts of FIG. 4-5. While for purposes of simplicity of explanation, the methods of FIGS. 4-5 are shown and described as respective series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the respective methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium. In addition, such an article of manufacture can include a compact Flash memory card, a universal serial bus memory card, a secure digital card or the like (e.g., mini SD, micro SD, etc.), or other suitable article of manufacture facilitating storage of digital information or portable storage of digital information.

FIG. 4 illustrates a flowchart of an example method 400 for fabricating a two-terminal memory according to additional embodiments of the present disclosure. In some embodiments, method 400 can employ a reduced oxygen environment at least in part for fabricating the two-terminal memory. In alternative or additional embodiments, at least a subset of the fabricating can employ a reactive ion etch process (e.g., a plasma etch process).

At 402, method 400 can comprise forming a first electrically conductive electrode layer above a substrate material. The first electrically conductive electrode layer can be a metal, conductive doped silicon, doped polysilicon, or doped silicon compound (e.g., p-type or n-type SiGe, etc.), or the like. At 404, method 400 can comprise forming an electrically resistive switching medium above the first conductive electrode layer. The resistive switching medium can be a material that is at least in part permeable to ions of at least one noble metal. At 406, method 400 can comprise forming a second electrically conductive electrode layer comprising the at least one noble metal, above the electrically resistive switching medium. Further, the second electrically conductive electrode layer can be configured to generate ions at a surface closest to the electrically resistive switching medium in response to an electric field applied across the two-terminal memory.

At 408, method 400 can comprise forming a diffusion mitigation layer comprising a non-noble metal above the second electrically conductive electrode layer. In some embodiments, the non-noble metal can be configured to mitigate exposure of the second electrically conductive electrode layer to oxygen or other undesired particles. Accordingly, the diffusion mitigation layer can resist or avoid penetration of oxygen or other reactive materials within the two-terminal memory, enhancing longevity and endurance of the memory.

In various embodiments, the inventors of the present invention have determined that the time between steps 406 and 408 should be controlled. Based upon experimental results, a wafer can be processed in step 406 and be subject to ambient atmosphere, and if step 408 is performed after about 24 hours the resistive switching medium may already have undesirable properties (e.g. oxidizing oxygen). In various embodiments, a wafer can be processed in step 406 and be subject to a vacuum or inert environment, and in such embodiments step 408 may be performed within about 24 hours following processing of the wafer in step 406 without the resistive switching medium having undesirable properties (e.g., oxidation, contamination with undesirable material, and so forth). In various experiments, if a wafer is processed in step 406, subject to the ambient atmosphere, and processed in step 408 within about 4 hours after step 406, the resistive switching medium may not have undesirable properties. In light of the above, various embodiments may include subjecting wafers, or the like, to a controlled environment, or to a reduced amount of time after step 406 and step 408 or a combination of the foregoing.

FIG. 5 illustrates a flowchart of an example method 500 for fabricating a two-terminal memory cell according to still other embodiments of the subject disclosure. At 502, method 500 can comprise providing a semiconductor substrate comprising at least one CMOS device formed on or at least in part within the semiconductor substrate. Additionally, at 504, method 500 can comprise forming a conductive wire on or in the semiconductor substrate. In some embodiments, the conductive wire can serve as a bitline, wordline, data line, source line, or the like, or a memory array device. At 506, method 500 can comprise forming a first electrode over the substrate and in contact with the conductive wire. At 508, method 500 can comprise forming a switching medium above the first electrode. The switching medium can be an electrically resistive material at least in part permeable to ions of at least one noble metal, in some embodiments. At 510, method 500 can comprise forming a barrier layer above the switching medium. The barrier layer can be formed to have a thickness in a range of about 3 nm to about 10 nm in further embodiments. In addition to the foregoing, at 512, method 500 can comprise forming a second electrode comprising the at least one noble metal over the barrier layer. At 514, method 500 can comprise forming a passivation layer above the second electrode. The passivation layer can be formed of a non-noble metal, for example. In various embodiments, the passivation layer can be formed to have a thickness in a range of about 10 nm to about 50 nm. Further to the above, method 500 can comprise forming a second conductive wire (e.g., a metal hardmask) in contact with the passivation layer.

In various embodiments, similar to the discussion above at FIG. 4, a wafer subject to the above process may have a controlled environment (e.g. vacuum, inert gas) between steps 508 and 514. In other embodiments, the elapsed time between steps 508 and 514 may be controlled, e.g. between about 30 minutes to about 4 hours, between about 1 to about 8 hours, or the like, if subject to the ambient air. In still other embodiments, a combination of maximum elapsed times and controlled environments may be used to reduce undesirable changes to switching medium, or the like.

Figure 6:
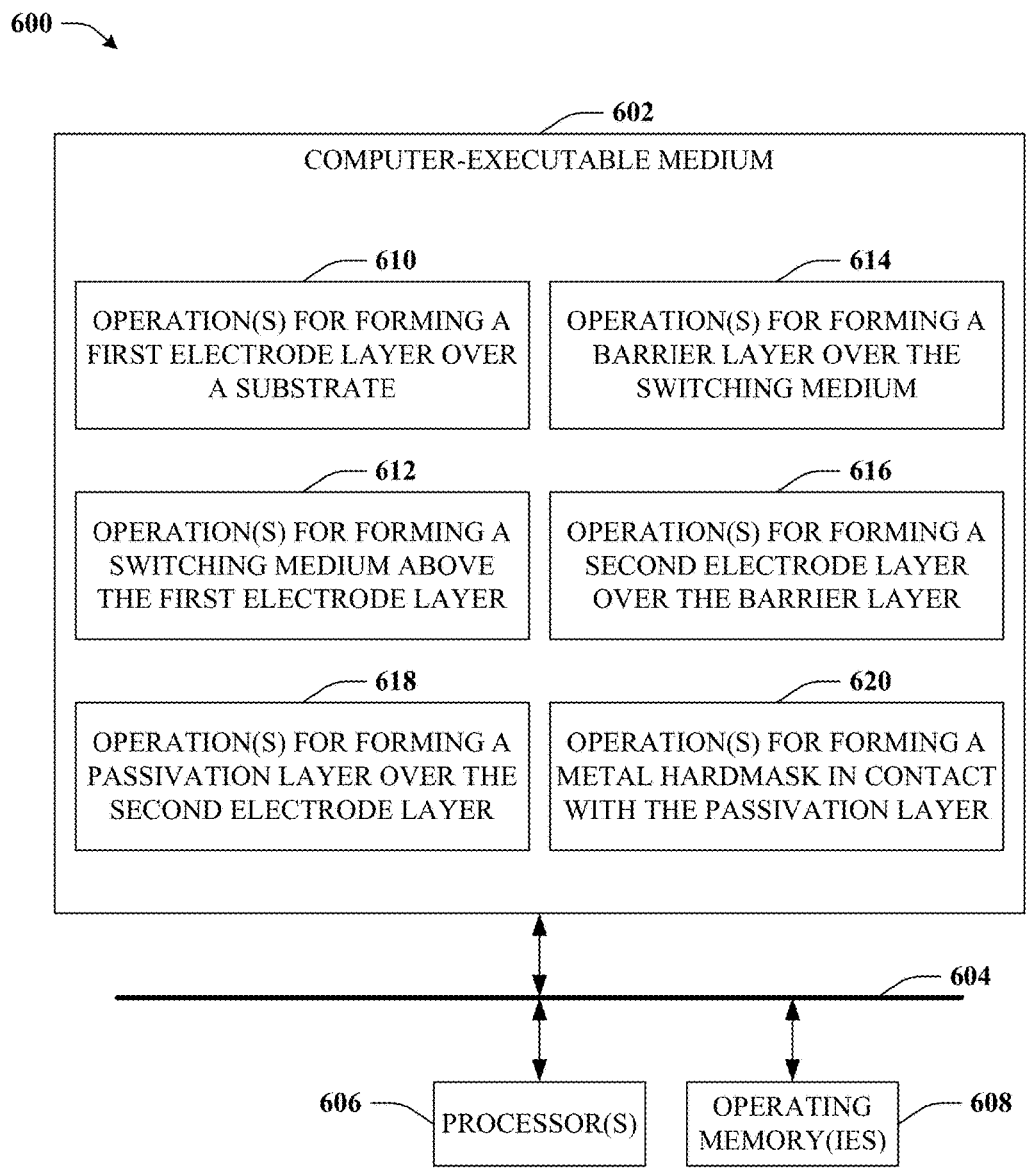
FIG. 6 depicts a block diagram of an example electronic device comprising a two-terminal memory technology resistant to environmental degradation.

FIG. 6 illustrates a block diagram of an example electronic device 600 for implementing one or more aspects of the subject disclosure. In various embodiments, electronic device 600 can be configured for fabricating or facilitating fabrication of a two-terminal memory cell. For instance, electronic device 600 can reside at least partially within a fabrication equipment, a memory, a memory module, a hand-held computer, a personal computer, a networked computer, or the like. It is to be appreciated that apparatus 600 is represented as including functional blocks, which can be functional blocks that represent functions implemented by a hardware, software, or combination thereof (e.g., firmware). In some aspects, the functional blocks can represent non-transitory computer-readable media. In other aspects, the functional blocks can represent transitory computer-readable media.

Electronic device 600 can comprise an electronically executable component 602 comprising stored operations that, once executed, facilitate the fabricating of a two-terminal memory cell having resistance to diffusion of external material within at least a subset of the two-terminal memory cell. Electronically executable component 602 can be operated, executed or accessed over a data communication interface 604. Data communication interface 604 can include a data bus, a dataline, a bitline, a wired or wireless communication interface, a network or network interface, or the like, or a suitable combination thereof. In at least one aspect of the subject disclosure, a subset of the stored operations for facilitating fabrication of the two-terminal memory cell can include computer-executable instructions stored in an operating memory(ies) 608 or executed by a processor(s) 606 to facilitate functionality of electronic device 600. In another aspect, one or more of the stored operations can be replaced by one or more electrically, mechanical, or electro-mechanical means for executing the operations, in response to activation by a processor means or a mechanical automation means.

As depicted, electronically executable component 602 can comprise operations 610 for forming a first electrode layer over a substrate. In various embodiments, the substrate can be a semiconductor substrate comprising at least one CMOS device formed thereon or at least in part therein. Additionally, electronically executable component 602 can comprise operations 612 for forming a switching medium above the first electrode layer, and operations 614 for forming a barrier layer over the switching medium. In some embodiments, operations 614 can be configured to form the barrier layer with a thickness in a range of about 3 nm to about 10 nm. In addition to the foregoing, electronically executable component 602 can comprise operations 616 for forming a second electrode layer over the barrier layer. The second electrode layer can be selected to be a noble metal, wherein ions of the noble metal are at least in part mobile within the switching medium. In further embodiments, electronically executable component 602 can comprise operations 618 for forming a passivation layer over the second electrode layer. The passivation layer can comprise a material selected from a non-noble metal, as one example, that resist or avoid mitigation of reactive materials (e.g., oxygen, etc.). Moreover, electronically executable component 602 can comprise operations 620 for forming a metal hardmask in contact with the passivation layer. The metal hardmask can be formed to provide a control wire for facilitating, at least in part, control operations with respect to the two-terminal memory cell.

In various embodiments of the subject disclosure, disclosed memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 7 and 8, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. Two-terminal memory, such as resistive-switching memory, can alleviate many problems observed by NAND FLASH at or below 25 nm technology. Aspects of the subject disclosure provide for improved endurance and longevity for two-terminal memory, mitigating or avoiding diffusion of external material such as oxygen or other reactive elements or compounds within at least a portion of the two-terminal memory.

Figure 7:
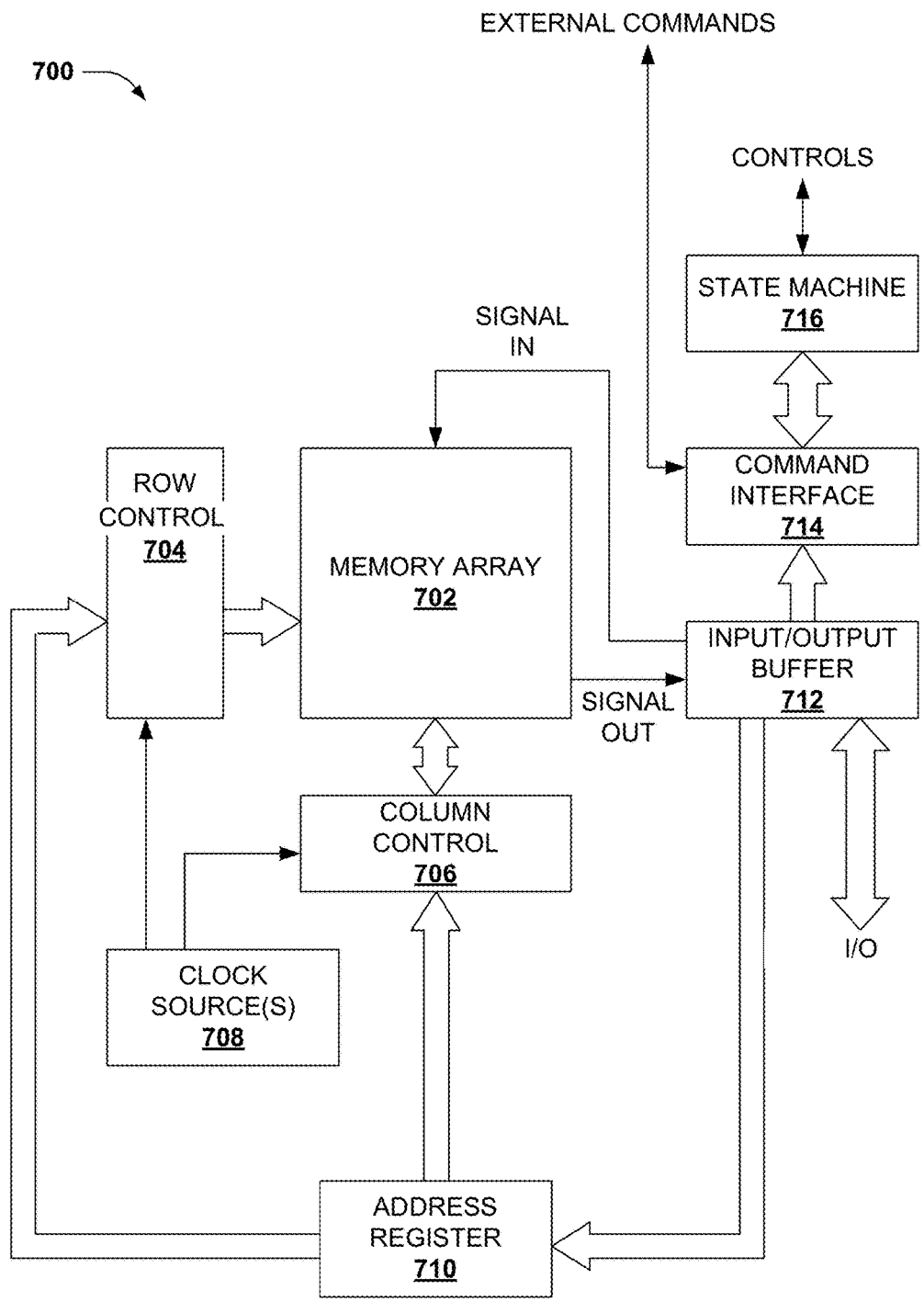
FIG. 7 illustrates a block diagram of a sample operating and control environment for a memory device according to various disclosed embodiments.

In order to provide a context for the various aspects of the disclosed subject matter, FIG. 7, as well as the following discussion, is intended to provide a brief, general description of a suitable environment in which various aspects of the disclosed subject matter can be implemented or processed. While the subject matter has been described above in the general context of two-terminal memory and process methodologies for fabricating or operating such memory, those skilled in the art will recognize that the subject disclosure also can be implemented in combination with other memory cells, arrays of memory cells or process methodologies. Moreover, those skilled in the art will appreciate that the disclosed processes can be practiced with a processing system or a computer processor, either alone or in conjunction with a host computer (e.g., computer 802 of FIG. 8, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 7 illustrates a block diagram of an example operating and control environment 700 for a memory cell array 702 according to aspects of the subject disclosure. In at least one aspect of the subject disclosure, memory cell array 702 can comprise a variety of memory cell technology, including two-terminal memory cell. Particularly, memory cell array can comprise resistive switching two-terminal memory cells resistant to diffusion of external material, as described herein.

A column controller 706 can be formed adjacent to memory cell array 702. Moreover, column controller 706 can be electrically coupled with bit lines of memory cell array 702. Column controller 706 can control respective bitlines, applying suitable program, erase or read voltages to selected bitlines.

In addition, operating and control environment 700 can comprise a row controller 704. Row controller 704 can be formed adjacent to column controller 706, and electrically connected with word lines of memory cell array 702. Row controller 704 can select particular rows of memory cells with a suitable selection voltage. Moreover, row controller 704 can facilitate program, erase or read operations by applying suitable voltages at selected word lines.

A clock source(s) 708 can provide respective clock pulses to facilitate timing for read, write, and program operations of row controller 704 and column controller 706. Clock source(s) 708 can further facilitate selection of word lines or bit lines in response to external or internal commands received by operating and control environment 700. An input/output buffer 712 can be connected to an external host apparatus, such as a computer or other processing device (not depicted, but see e.g., computer 802 of FIG. 8, infra) by way of an I/O buffer or other I/O communication interface. Input/output buffer 712 can be configured to receive write data, receive an erase instruction, output readout data, and receive address data and command data, as well as address data for respective instructions. Address data can be transferred to row controller 704 and column controller 706 by an address register 710. In addition, input data is transmitted to memory cell array 702 via signal input lines, and output data is received from memory cell array 702 via signal output lines. Input data can be received from the host apparatus, and output data can be delivered to the host apparatus via the I/O buffer.

Commands received from the host apparatus can be provided to a command interface 714. Command interface 714 can be configured to receive external control signals from the host apparatus, and determine whether data input to the input/output buffer 712 is write data, a command, or an address. Input commands can be transferred to a state machine 716.

State machine 716 can be configured to manage programming and reprogramming of memory cell array 702. State machine 716 receives commands from the host apparatus via input/output buffer 712 and commands interface 714, and manages reads, writes, erases, data input, data output, and similar functionality associated with memory cell array 702. In some aspects, state machine 716 can send and receive acknowledgments and negative acknowledgments regarding successful receipt or execution of various commands.

To implement read, write, erase, input, output, etc., functionality, state machine 716 can control clock source(s) 708. Control of clock source(s) 708 can cause output pulses configured to facilitate row controller 704 and column controller 706 implementing the particular functionality. Output pulses can be transferred to selected bit lines by column controller 706, for instance, or word lines by row controller 704, for instance.

In connection with FIG. 8, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 8:
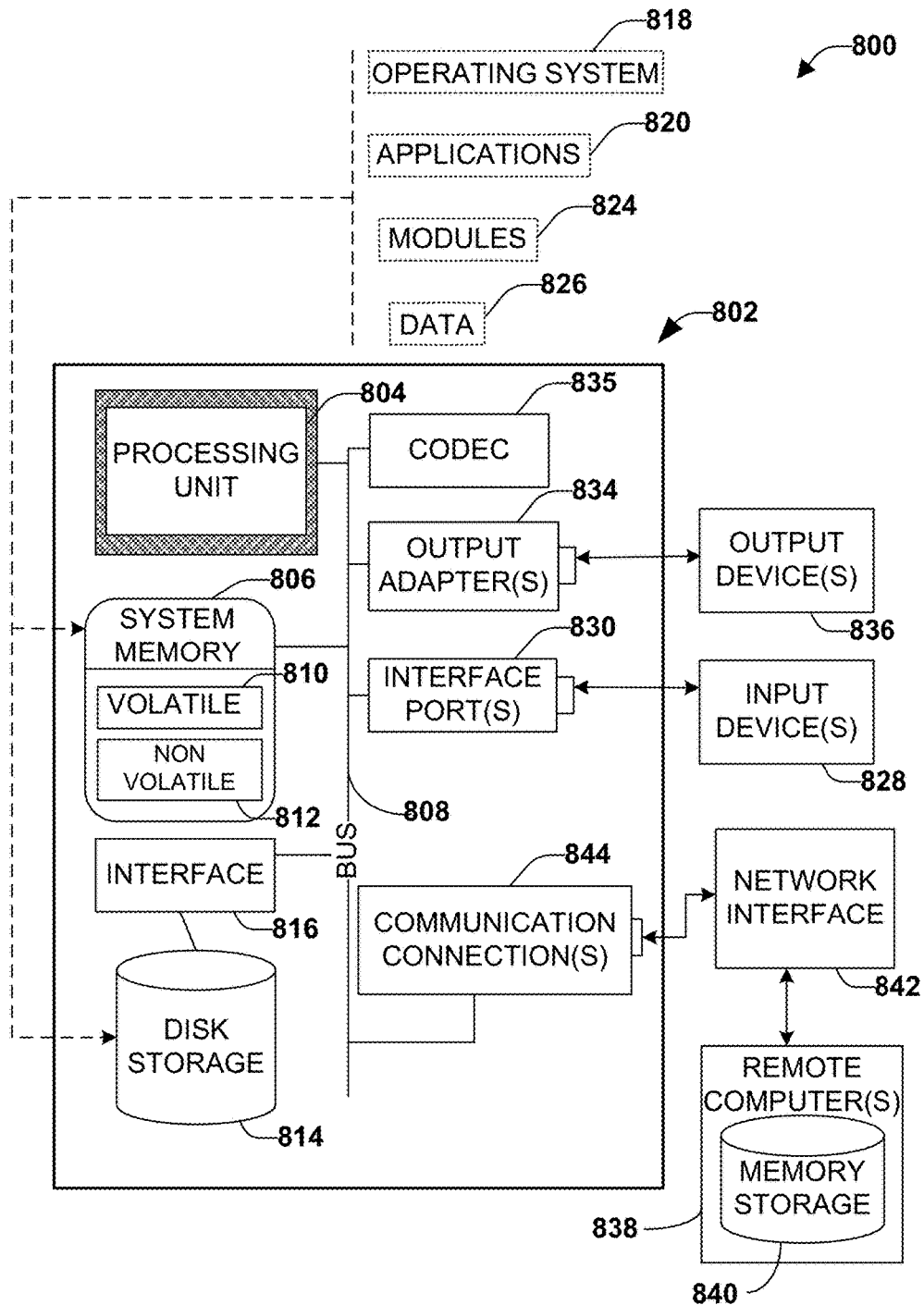
FIG. 8 depicts a block diagram of an example computing environment that can be implemented in conjunction with various embodiments.

With reference to FIG. 8, a suitable operating environment 800 for implementing various aspects of the claimed subject matter includes a computer 802. The computer 802 includes a processing unit 804, a system memory 806, a codec 835, and a system bus 808. The system bus 808 couples system components including, but not limited to, the system memory 806 to the processing unit 804. The processing unit 804 can be any of various available processors. Dual microprocessors and other multiprocessor architectures also can be employed as the processing unit 804.

The system bus 808 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 806 includes volatile memory 810 and non-volatile memory 812, which can employ one or more of the disclosed memory architectures, memory cells, memory processes, or the like, in various embodiments. The basic input/output system (BIOS), containing the basic routines to transfer information between elements within the computer 802, such as during start-up, is stored in non-volatile memory 812. In addition, according to present innovations, codec 835 may include at least one of an encoder or decoder, wherein the at least one of an encoder or decoder may consist of hardware, software, or a combination of hardware and software. Although, codec 835 is depicted as a separate component, codec 835 may be contained within non-volatile memory 812. By way of illustration, and not limitation, non-volatile memory 812 can include read only memory (ROM), programmable ROM (PROM), electrically programmable ROM (EPROM), electrically erasable programmable ROM (EEPROM), or Flash memory. Non-volatile memory 812 can employ one or more of the disclosed memory architectures, in at least some disclosed embodiments. Moreover, non-volatile memory 812 can be computer memory (e.g., physically integrated with computer 802 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 810 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 802 may also include removable/non-removable, volatile/non-volatile computer storage medium. FIG. 8 illustrates, for example, disk storage 814. Disk storage 814 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 814 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 814 to the system bus 808, a removable or non-removable interface is typically used, such as interface 816. It is appreciated that disk storage 814 can store information related to a user. Such information might be stored at or provided to a server or to an application running on a user device. In one embodiment, the user can be notified (e.g., by way of output device(s) 836) of the types of information that are stored to disk storage 814 and/or transmitted to the server or application. The user can be provided the opportunity to opt-in or opt-out of having such information collected and/or shared with the server or application (e.g., by way of input from input device(s) 828).

It is to be appreciated that FIG. 8 describes software that acts as an intermediary between users and the basic computer resources described in the suitable operating environment 800. Such software includes an operating system 818. Operating system 818, which can be stored on disk storage 814, acts to control and allocate resources of the computer 802. Applications 820 take advantage of the management of resources by operating system 818 through program modules 824, and program data 826, such as the boot/shutdown transaction table and the like, stored either in system memory 806 or on disk storage 814. It is to be appreciated that the claimed subject matter can be implemented with various operating systems or combinations of operating systems.

A user enters commands or information into the computer 802 through input device(s) 828. Input devices 828 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 804 through the system bus 808 via interface port(s) 830. Interface port(s) 830 include, for example, a serial port, a parallel port, a game port, and a universal serial bus (USB). Output device(s) 836 use some of the same type of ports as input device(s) 828. Thus, for example, a USB port may be used to provide input to computer 802 and to output information from computer 802 to an output device 836. Output adapter 834 is provided to illustrate that there are some output devices, such as monitors, speakers, and printers, among other output devices, which require special adapters. The output adapter 834 can include, by way of illustration and not limitation, video and sound cards that provide a means of connection between the output device 836 and the system bus 808. It should be noted that other devices and/or systems of devices provide both input and output capabilities such as remote computer(s) 838.

Computer 802 can operate in a networked environment using logical connections to one or more remote computers, such as remote computer(s) 838. The remote computer(s) 838 can be a personal computer, a server, a router, a network PC, a workstation, a microprocessor based appliance, a peer device, a smart phone, a tablet, or other network node, and typically includes many of the elements described relative to computer 802. For purposes of brevity, only a memory storage device 840 is illustrated with remote computer(s) 838. Remote computer(s) 838 is logically connected to computer 802 through a network interface 842 and then connected via communication connection(s) 844. Network interface 842 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 844 refers to the hardware/software employed to connect the network interface 842 to the system bus 808. While communication connection 844 is shown for illustrative clarity inside computer 802, it can also be external to computer 802. The hardware/software necessary for connection to the network interface 842 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory cell, comprising:
a monolithic stack comprising a plurality of layers stacked in a first direction, the plurality of layers comprising:
a bottom electrode layer comprising an electrically conductive material;
a switching medium layer, above the bottom electrode layer in the first direction, comprising an electrically resistive material;
a top electrode layer, above the switching medium layer in the first direction, comprising a noble metal that produces ions at a boundary of the top electrode layer and the switching medium layer in response to an electric field applied to the memory cell, wherein the switching medium layer is at least in part permeable to the ions; and
a passivation layer, above the top electrode layer in the first direction, comprising a non-noble metal, wherein the passivation layer reduces diffusion of one or more atmospheric gasses, above the passivation layer in the first direction, into the top electrode layer and switching medium layer.

2. The memory cell of claim 1, wherein the passivation layer is in immediate contact with the top electrode layer.

3. The memory cell of claim 1, wherein the non-noble metal of the passivation layer is selected from a group consisting of: W, tungsten nitride, Ti, TiW, Al, Cu and TiN.

4. The memory cell of claim 1, wherein the passivation layer is deposited above the top electrode layer in an oxygen-free environment.

5. The memory cell of claim 4, wherein the passivation layer is deposited using a physical vapor deposition process.

6. The memory cell of claim 4, wherein the passivation layer is deposited using a chemical vapor deposition process.

7. The memory cell of claim 1, wherein the noble metal of the top electrode layer is Ag.

8. The memory cell of claim 1, wherein the electrically conductive material of the bottom electrode layer comprises a conductive metal and a doped silicon material.

9. The memory cell of claim 1, wherein the switching medium layer is comprised of an undoped amorphous Si, an amorphous compound of Si, or a Si sub-oxide.

10. The memory cell of claim 1, wherein the passivation layer has a thickness in a range of about 10 nanometers (nm) and about 50 nm.

11. The memory cell of claim 1, further comprising a barrier layer disposed between the switching medium layer and the top electrode layer selected from a group consisting of: Ti, TiN and TiO.

12. The memory cell of claim 11, wherein the barrier layer has a thickness of about 3 nm to about 10 nm.

13. The memory cell of claim 1, further comprising:
a semiconductor substrate upon which the memory cell is disposed, the semiconductor substrate comprising at least one complementary metal oxide semiconductor device;
a first metal conductor built on the semiconductor substrate and in electrical contact with the bottom electrode layer; and
a second metal conductor formed at least in part as a metal hardmask in contact with the passivation layer, wherein the first metal conductor and the second metal conductor facilitate application of a signal to the memory cell.

14. A method of fabricating a memory cell, comprising:
forming a first electrically conductive electrode layer above a substrate material;
forming an electrically resistive switching medium above the first electrically conductive electrode layer that is permeable to ions of at least one noble metal;
forming a second electrically conductive electrode layer comprising the at least one noble metal above the electrically resistive switching medium; and
forming a diffusion mitigation layer comprising a non-noble metal above the second electrically conductive electrode layer, wherein the diffusion mitigation layer is configured to mitigate diffusion of one or more atmospheric gasses above the diffusion mitigation layer into the second electrically conductive electrode layer and electrically resistive switching medium; and
wherein the second electrically conductive electrode layer is configured to generate ions at least at a surface closest to the electrically resistive switching medium in response to an electric field.

15. The method of claim 14, wherein the non-noble metal of the diffusion mitigation layer is selected from a group consisting of: W, Ti, TiN, Al, Cu, WN, and TiW.

16. The method of claim 14, further comprising subjecting the memory cell to an ambient atmosphere after the forming the second electrically conductive electrode layer, wherein the forming the diffusion mitigation layer is performed within about 4 hours of the forming the second electrically conductive electrode layer.

17. The method of claim 14, further comprising forming a barrier layer that is selected from a group consisting of: Ti, TiN and TiO disposed between the electrically resistive switching medium and the second electrically conductive electrode layer, wherein the barrier layer has a thickness about 10 nanometers (nm) or less, and the diffusion mitigation layer has a thickness within a range of about 10 nm to about 50 nm.

18. The method of claim 14, further comprising subjecting the memory cell to an inert atmosphere after the forming the second electrically conductive electrode layer, wherein the forming the diffusion mitigation layer is performed within about 24 hours of the forming the second electrically conductive electrode layer.

19. A device, comprising:
an array of memory cells, where a memory cell of the array of memory cells comprises:
a monolithic stack comprising a plurality of layers stacked in a first direction, the plurality of layers comprising:
a bottom electrode layer comprising an electrically conductive material;
a switching medium layer, above the bottom electrode layer in the first direction, comprising an electrically resistive material;
a top electrode layer, above the switching medium layer in the first direction, comprising a noble metal that produces ions at a boundary of the top electrode layer and the switching medium layer in response to an electric field applied to the memory cell, wherein the switching medium layer is at least in part permeable to the ions; and
a passivation layer, above the top electrode layer in the first direction, comprising a non-noble metal, wherein the passivation layer reduces diffusion of one or more atmospheric gasses, above the passivation layer in the first direction, into the top electrode layer and switching medium layer.

20. The device of claim 19, wherein the passivation layer is in immediate contact with the top electrode layer.

* * * * *